(12) United States Patent
Shima

(10) Patent No.: US 6,380,604 B1
(45) Date of Patent: Apr. 30, 2002

(54) QUANTUM SEMICONDUCTOR DEVICE HAVING QUANTUM DOTS AND OPTICAL DETECTORS USING THE SAME

(75) Inventor: Masashi Shima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/818,520

(22) Filed: Mar. 28, 2001

(30) Foreign Application Priority Data

May 18, 2000 (JP) .................................. 2000-146849
Nov. 2, 2000 (JP) .................................. 2000-336066

(51) Int. Cl.[7] .................. H01L 31/00; H01L 31/072
(52) U.S. Cl. .................. 257/466; 257/465; 257/21; 257/184
(58) Field of Search ................ 257/21, 184, 466, 257/465

(56) References Cited

U.S. PATENT DOCUMENTS 6,011,271 A  *  1/2000  Sakuma ........................ 257/20

FOREIGN PATENT DOCUMENTS

JP          5-152582           6/1993

* cited by examiner

Primary Examiner—Jerome Jackson, Jr.
(74) Attorney, Agent, or Firm—Armstrong, Westerman & Hattori, LLP

(57) ABSTRACT

An optical detector includes a pyramidal etch-pit formed in a layered semiconductor structure. A channel layer is provided on facets of the pyramidal etch-pit and a hole-accumulation layer, sandwiched by a pair of barrier layers is formed on the channel layer. Further, electrodes are provided on a top surface and a bottom surface of the layered semiconductor structure. An optical window is provided so as to introduce an optical beam to the channel layer or the hole-accumulation layer.

43 Claims, 24 Drawing Sheets

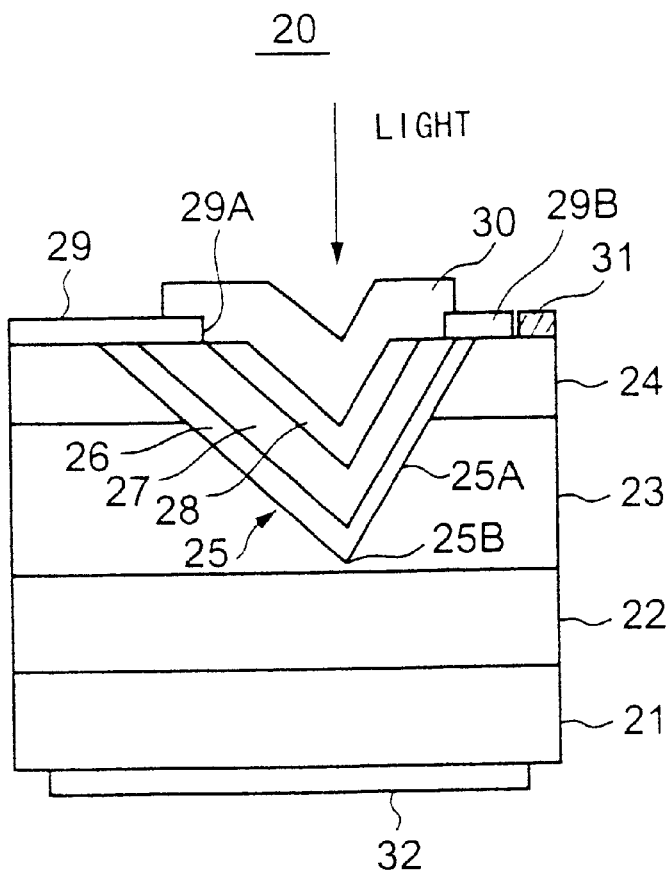
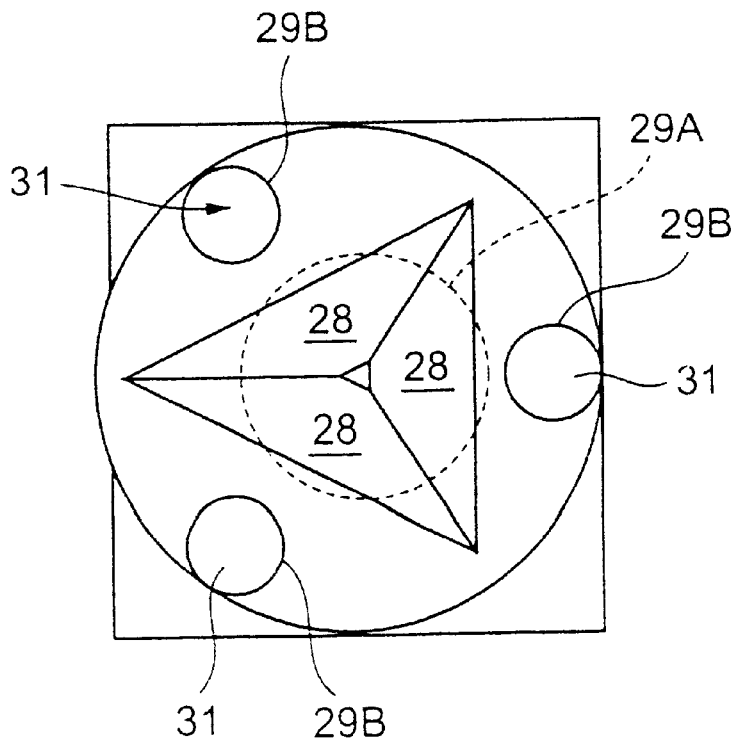

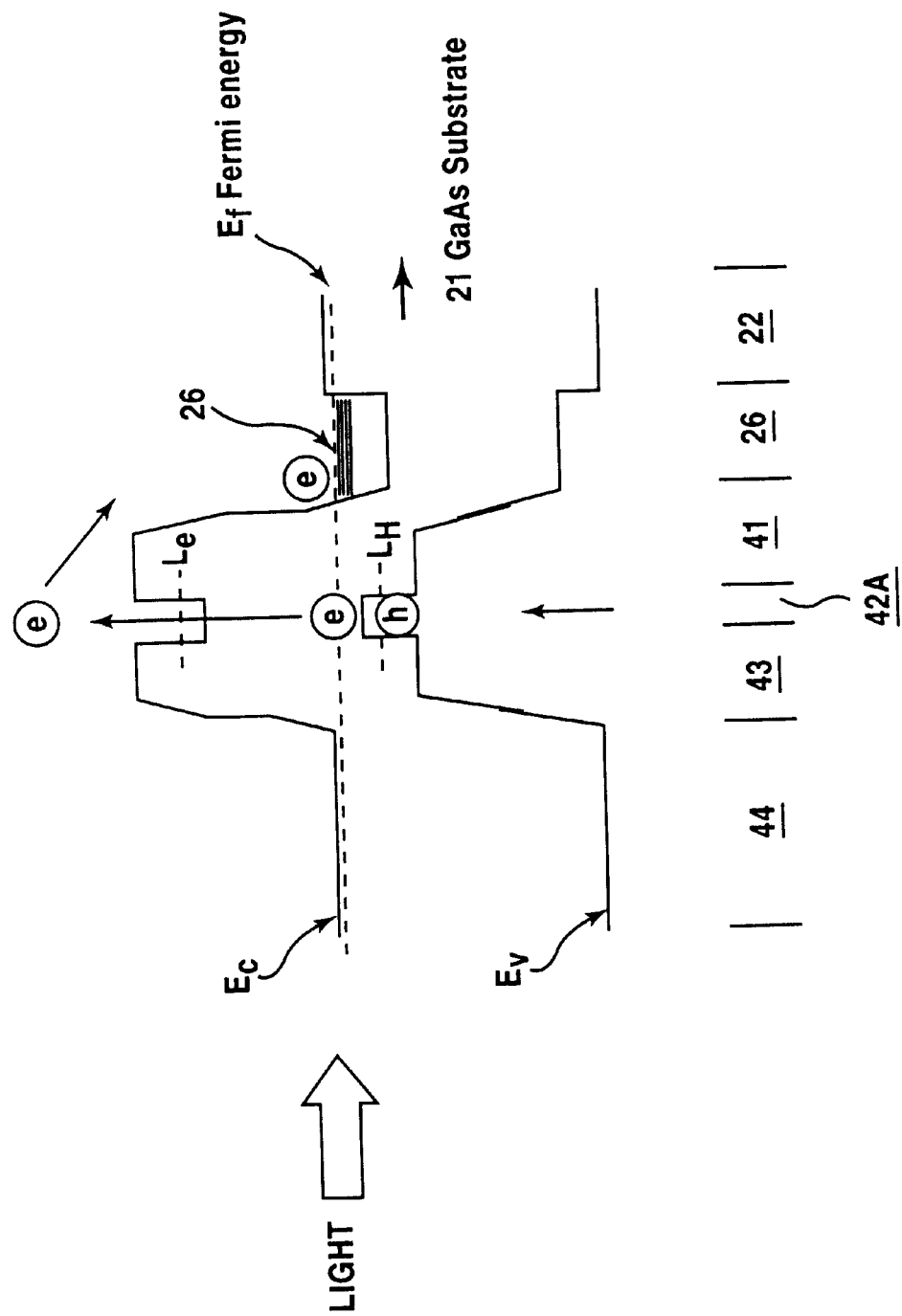

↑ CURRENT MODULATION AS
  ANOPTICAL MEMORY EFFECT

↕ CURRENT MODULATION AS
  ANOPTICAL DETECTOR EFFECT

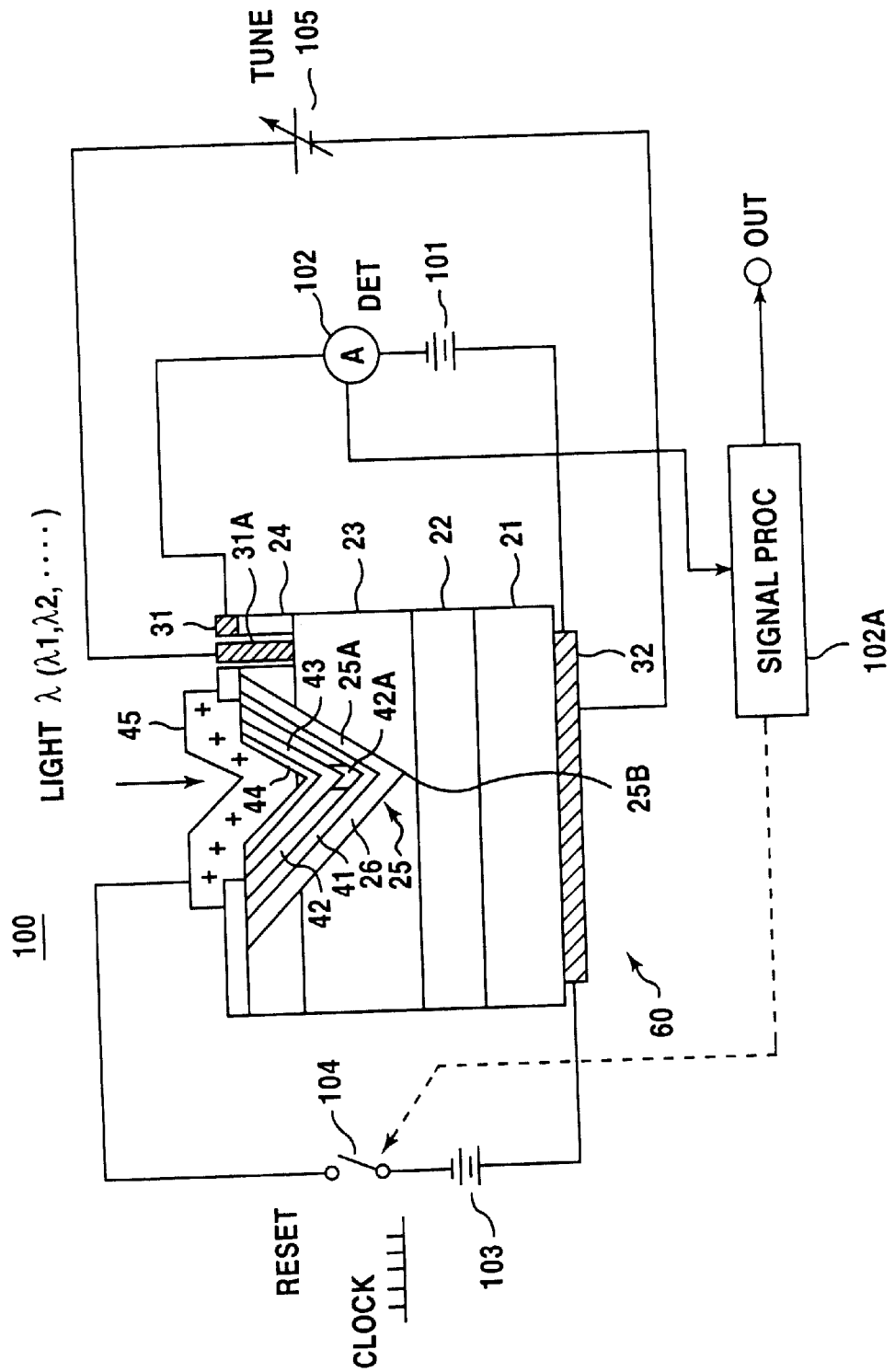

QUANTUM SEMICONDUCTOR DEVICE HAVING QUANTUM DOTS AND OPTICAL DETECTORS USING THE SAME

CROSS-REFERENCE TO RELATED APPLICATION

The present application is based on Japanese priority applications No. 2000-146849 and 2000-336066 respectively filed on May 18, 2000 and Nov. 2, 2000, the entire contents of which are hereby incorporated by reference.

BACKGROUND OF THE INVENTION

The present invention generally relates to semiconductor devices and more particularly to a quantum semiconductor device having quantum dots. Further, the present invention relates to optical detectors and optical memory devices that use such quantum dots.

In the field of optical telecommunication, various optical detectors are used for detecting optical signals transmitted through an optical fiber. Such optical detectors include high-speed PIN photodiodes. With recent increase of signal traffic in such optical telecommunication systems, on the other hand, there is a demand for faster optical detectors that are capable of operating with low power consumption and high photosensitivity.

In order to deal with sharply increasing optical traffic in such optical telecommunication systems, the use of so-called wavelength-multiplexing technology is spreading in the art of optical telecommunication. In such a wavelength-multiplexing technology, there is a demand for optical detectors that are capable of tuning to various optical wavelengths.

Conventionally, photodiodes having a p-n junction or a pin junction have been used extensively in optical telecommunication systems for high-speed detection of optical signals.

FIG. 1 shows the construction of a typical conventional p-n junction photodiode 10.

Referring to FIG. 1, the photodiode 10 is constructed on a substrate 11 of n-type InP, and includes a buffer layer 12 of n-type InP formed on the substrate 11, an optical absorption layer 13 of $n^-$-type InGaAs formed on the buffer layer 12, and a $p^+$-type region 13A of InGaAs formed inside the optical absorption layer 13, wherein the optical absorption layer 13 carries thereon an electrode 14 in correspondence to the $p^+$-type region 13A. Further, a ring-shaped electrode 16 having an opening acting as an optical window is provided on a bottom principal surface of the InP substrate 11. Further, the exposed top surface of the optical absorption layer 13 is protected by an SiN passivation film 15. A photodiode having a pin junction also has a similar structure.

In view of the fact that the photodiode 10 of FIG. 1 has a planar construction, it is necessary in such a photodiode 10 to introduce incoming optical radiation over a substantial area in order to detect the optical current with sufficient S/N ratio. In other words, the photodiode 10 of FIG. 1 has a drawback of low sensitivity.

In the photodiode 10 of FIG. 1, it is possible to reduce the optical power needed for the photodiode to carry out the photodetection, by decreasing the optical area, in other words the area of the $p^+$-type region 13A. However, such a decrease of the optical area is limited by the photolithographic process, and there arises a problem in that the photodiode 10 having the planar structure suffers from the problem of low sensitivity of photodetection.

In the field of information technology, on the other hand, there is occurring a sharp increase of data to be processed, and there is growing a need for a high-speed, large-capacity memory device for dealing with such large amount of data. When such a high-speed, large-capacity memory device is to be realized by a conventional semiconductor memory device, there arises a need of providing a very complex wiring pattern, and the complexity of the wiring pattern increases with increasing integration density of the semiconductor memory device. Associated therewith, it is expected that various problems, such as signal delay, decrease of yield and increase of cost, would be caused when such a memory device is constructed by conventional semiconductor memory devices.

In this regard, optical semiconductor memory devices that are written with information by a feeble optical signal are expected as being a device capable of overcoming the foregoing problems of semiconductor memory devices. By using optical semiconductor memory devices, it is expected to carry out writing and reading of information directly by an optical beam that can carry a large amount of information.

Conventionally, there is proposed a photo-electron integrated device that uses discrete energy levels characteristic to quantum dots for detection of optical signals as described in the Japanese Laid-Open Patent Publication 8-32046. According to this prior art, a number of quantum dots are formed in a planar structure and the quantum dots are used for optical detection, optical modulation, or optical output of wavelength-multiplex optical signals.

In such optical signal-processing device that uses quantum dots, it is necessary to form each of the quantum dots such that the quantum dot is tuned to the wavelength of the optical signal component to be detected. However, it is extremely difficult to form the desired quantum dots with necessary precision, quality and yield as long as conventional patterning process is used. Further, it is difficult to form the quantum dots with necessary size.

SUMMARY OF THE INVENTION

Accordingly, it is a general object of the present invention to provide a novel and useful quantum semiconductor device wherein the foregoing problems are eliminated.

Another and more specific object of the present invention is to provide a high-sensitivity optical detector.

Another object of the present invention is to provide an optical semiconductor memory device that is capable of being written with information by a feeble optical beam.

Another object of the present invention is to provide a quantum semiconductor device having quantum dots wherein the energy level of the quantum dots can be controlled as desired.

Another object of the present invention is to provide a spectrum analyzer that uses a quantum semiconductor device including therein quantum dots.

Another object of the present invention is to provide an optical receiver of wavelength-multiplex optical signals for selectively detecting an optical signal component in an incoming wavelength-multiplex optical signal.

Another object of the present invention is to provide a semiconductor optical detector, comprising:

a first semiconductor layer having a first conductivity type;

a second semiconductor layer formed on said first semiconductor layer;

a third semiconductor layer formed on said second semiconductor layer, said third semiconductor layer having said first conductivity type;

a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface;

a channel layer covering said plurality of facets continuously in said pyramidal pit, said channel layer having said first conductivity type;

a barrier layer formed in said pyramidal pit so as to cover said channel layer;

a cap layer formed in said pyramidal pit so as to cover said barrier layer;

an optical window formed on said cap layer;

a first electrode formed on said third semiconductor layer; and a second electrode formed on said first semiconductor layer.

Another object of the present invention is to provide a semiconductor optical detector, comprising:

a substrate having a first conductivity type;

a first semiconductor layer formed on said substrate, said first semiconductor layer having said first conductivity type;

a second semiconductor layer formed on said first semiconductor layer;

a third semiconductor layer formed on said second semiconductor layer, said third semiconductor layer having said first conductivity type;

a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface;

a channel layer covering said plurality of facets continuously in said pyramidal pit, said channel layer having said first conductivity type;

a barrier layer formed in said pyramidal pit so as to cover said channel layer;

a cap layer formed in said pyramidal pit so as to cover said barrier layer;

a first electrode formed on said third semiconductor layer; and a second electrode formed on a bottom principal surface of said substrate, said second electrode having an optical window.

According to the present invention, an optical beam coming incident through the optical window induces an optical excitation of electron-hole pairs in the channel layer, and a photocurrent flows through the channel layer. As the channel layer covers the facets of the pyramidal pit, the photocurrent flows through the channel layer from the first electrode to the second electrode on each of the foregoing facets. Thus, the photocurrents flowing through the channel layer are collected at the apex of the pyramidal pit and are transferred therefrom to the second electrode. Thus, the optical detector of the present invention can detect the photocurrent even in such a case the optical power of the incoming optical beam is very weak.

Another object of the present invention is to provide an optical semiconductor memory device, comprising:

a first semiconductor layer having a first conductivity type;

a second semiconductor layer formed on said first semiconductor layer;

a third semiconductor layer formed on said second semiconductor layer, said third semiconductor layer having said first conductivity type;

a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface;

a channel layer covering said plurality of facets continuously in said pyramidal pit, said channel layer having said first conductivity type;

a first barrier layer formed in said pyramidal pit so as to cover said channel layer continuously, said first barrier layer having a second conductivity type;

a hole-accumulation layer formed on said first barrier layer in said pyramidal pit;

a second barrier layer formed in said pyramidal pit so as to cover said hole-accumulation layer, said second barrier layer having said second conductivity type;

a cap layer formed in said pyramidal pit so as to cover said second barrier layer;

an optical window formed on said cap layer;

a first electrode formed on said third semiconductor layer; and a second electrode formed on said first semiconductor layer.

Another object of the present invention is to provide an optical semiconductor memory device, comprising:

a substrate having a first conductivity type;

a first semiconductor layer formed on said substrate, said first semiconductor layer having said first conductivity type;

a second semiconductor layer formed on said first semiconductor layer;

a third semiconductor layer formed on said second semiconductor layer, said third semiconductor layer having said first conductivity type;

a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface;

a channel layer covering said plurality of facets continuously in said pyramidal pit, said channel layer having said first conductivity type;

a first barrier layer formed in said pyramidal pit so as to cover said channel layer continuously, said first barrier layer having a second conductivity type;

a hole-accumulation layer formed on said first barrier layer in said pyramidal pit;

a second barrier layer formed in said pyramidal pit so as to cover said hole-accumulation layer, said second barrier layer having said second conductivity type;

a cap layer formed in said pyramidal pit so as to cover said second barrier layer;

a first electrode formed on said third semiconductor layer; and a second electrode formed on a bottom principal surface of said substrate, said second electrode having an optical window.

According to the present invention, an optical beam incident through the optical window induces an optical excitation of electron-hole pairs. Thereby, the holes thus excited are retained in a potential well formed in the hole-accumulation layer, while the electrons reach the channel layer by overriding the first barrier layer. The electrons thus reached the channel layer are absorbed by the second electrode. As a result, there occurs an accumulation of holes in the hole-accumulation layer and the conduction band and the valence band of the hole-accumulation layers are shifted in the lower energy side with respect to the channel layer. In response to such a change of the band energy, the carrier density in the channel layer is increased and the electric current flowing through the channel layer is changed in response to the number of the holes accumulated in the hole-accumulation layer. Thus, the optical semiconductor memory device of the present invention can read out the information written optically into the hole-accumulation layer in the form of holes by detecting the electric current flowing between the first and second electrodes. In order to achieve a reliable retention of holes in the hole-accumulation layer, it is preferable to form a quantum dot in the hole-accumulation layer in the vicinity of the apex of the pyramidal pit. By providing a transparent electrode in correspondence to the optical window, it is possible to erase the written information by injecting electrons from the transparent electrode such that the accumulated holes are annihilated by the injected electrons.

Another object of the present invention is to provide a quantum semiconductor device, comprising:

a first semiconductor layer having a first conductivity type;

a second semiconductor layer formed on said first semiconductor layer;

a third semiconductor layer formed on said second semiconductor layer, said third semiconductor layer having said first conductivity type;

a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface;

a channel layer covering said plurality of facets continuously in said pyramidal pit, said channel layer having said first conductivity type;

a first barrier layer formed in said pyramidal pit so as to cover said channel layer continuously, said first barrier layer having a second conductivity type;

a hole-accumulation layer formed on said first barrier layer in said pyramidal pit;

a second barrier layer formed in said pyramidal pit so as to cover said hole-accumulation layer, said second barrier layer having said second conductivity type;

a cap layer formed in said pyramidal pit so as to cover said second barrier layer;

an optical window formed on said cap layer;

a first electrode formed on said first semiconductor layer; and a second electrode formed on said second semiconductor layer in Schottky contact therewith.

According to the present invention, the size of the quantum dot formed in the hole-accumulation layer in correspondence to the apex of the pyramidal pit is changed in response to a control voltage applied to the second electrode. It should be noted that the control voltage applied to the second electrode changes the extension of the depletion layer associated with the Schottky contact and hence the size of the quantum dot. With the change of the quantum dot, the quantum levels associated with the quantum dot are also changed.

Other objects and further features of the present invention will become apparent from the following detailed description when read in conjunction with the attached drawings.

BRIEF DESCRIPTION OF THE DRAWINGS

FIGS. 2A and 2B are diagrams showing the construction of a semiconductor optical detector according to a first embodiment of the present invention;

FIG. 7 is a band diagram showing the principle of the optical semiconductor memory device of FIGS. 6A and 6B;

FIG. 14 is a diagram showing the construction of an optical receiver of wavelength-multiplexed optical signals according to a seventh embodiment of the present invention;

DETAILED DESCRIPTION OF THE INVENTION

[First Embodiment]

Figure 1:
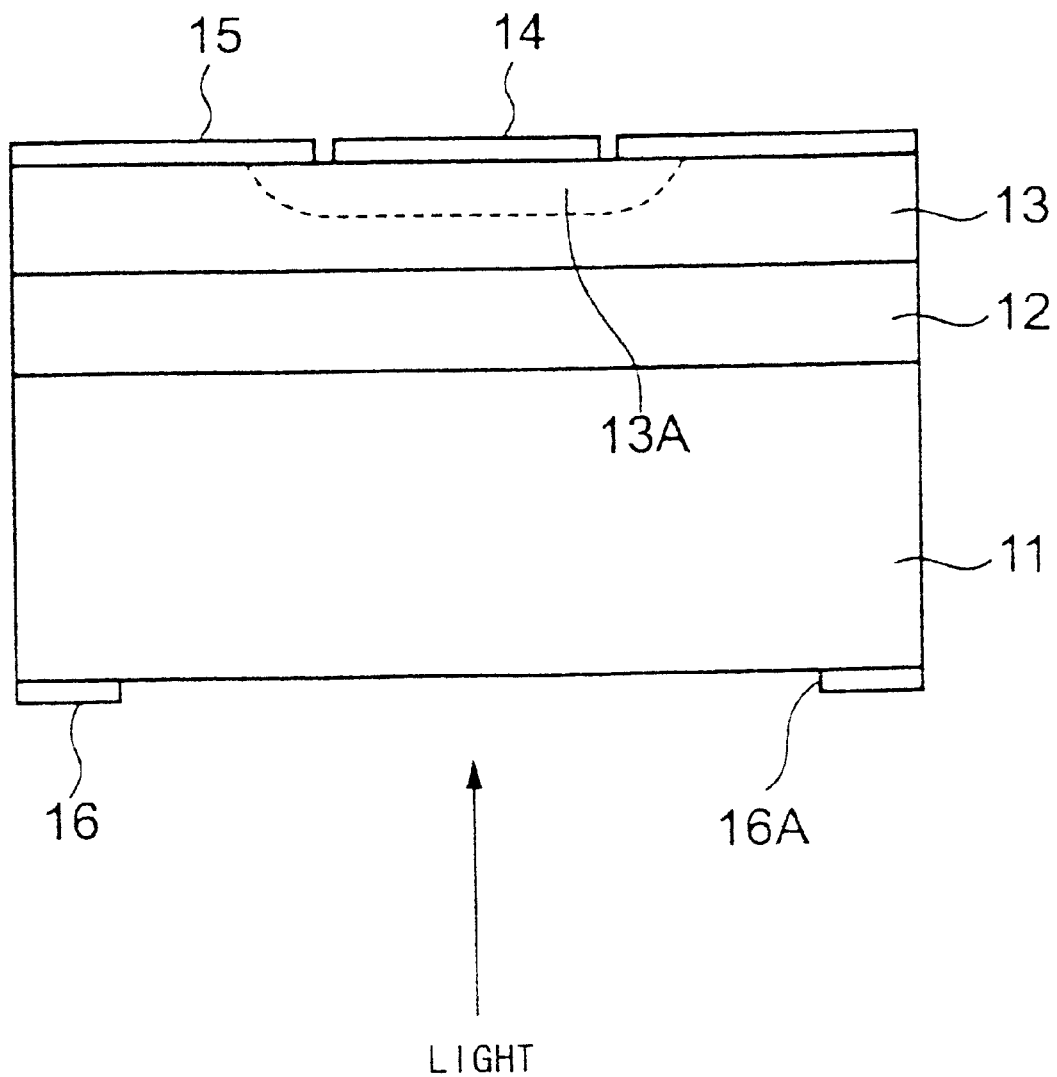
FIG. 1 is a diagram showing the construction of a photodiode according to a related art.

FIGS. 2A and 2B show the construction of an optical detector 20 according to a first embodiment of the present invention respectively in a cross-sectional view and a plan view.

Referring to FIG. 2A, the optical detector 20 is constructed on a (111)B surface of a GaAs substrate 21 of $n^+$-type and includes a GaAs layer 22 of $n^+$-type formed on the GaAs substrate 21 with a thickness of about 0.1 μm, an undoped GaAs layer 23 formed on the GaAs layer 22 with a thickness of about 0.3 μm, and a GaAs layer 24 of $n^+$-type formed on the GaAs layer 23 with a thickness of about 0.1 μm, wherein the GaAs layer 22 and the GaAs layer 24 are doped with Se to a carrier density of about $5 \times 10^{18}$ cm$^{-3}$.

The GaAs layer 24 is formed with a tetrahedral etch-pit 25 defined by three facets 25A each forming a (111)A surface such that an apex 25B of the tetrahedron, in which the three facets 25A merge together, is located in the GaAs layer 23 in the vicinity to the interface between the GaAs layer 23 and the underlying GaAs layer 22.

In the etch-pit 25, each facet 25A carries thereon a channel layer 26 of n-type InGaAs doped with Se to the carrier density of $1 \times 10^{18}$ cm$^{-3}$ in such a manner that the channel layer 26 covers the three facets 25A continuously, including the apex 25B of the etch-pit 25, with a thickness of typically about 15 nm. The channel layer 26 is covered, in the foregoing etch-pit 25, with a barrier layer 27 of undoped AlGaAs with a thickness of about 20 nm, and a cap layer 28 of undoped GaAs covers the barrier layer 27 in the etch-pit 25 with a thickness of about 10 nm.

Further, the layer 24 of $n^+$-type GaAs is covered with an SiO$_2$ film 29 having a circular opening 29A, wherein the circular opening is formed so as to expose the undoped GaAs layer 28 in the etch-pit 25.

On the SiO$_2$ film 29, there is provided a transparent optical window 30 so as to cover the GaAs cap layer 28 via the opening 29A, wherein the optical window 30 may be formed of an SiN anti-reflection film or an SiO$_2$ anti-reflection film. Alternately, the optical window 30 may be formed of an alternate stacking of an SiN film and an SiO$_2$ film forming a multilayer anti-reflection film. Further, the optical window 30 may be formed of an alternate stacking of a GaAs layer and an AlGaAs layer.

As will be explained later, the SiO$_2$ film 29 covering the $n^+$-type GaAs layer 24 is the film used as an etching mask when forming the etch-pit 25 by a wet etching process. The SiO$_2$ film 29 is further formed with an opening 29B exposing the surface of the GaAs layer 24, and a drain electrode 31 is provided in ohmic contact with the GaAs layer 24 at the foregoing opening 29B.

Referring to the plan view of FIG. 2B, it can be seen that the drain electrode 31 is provided in correspondence to each edge of the tetrahedral etch-pit 25 on the surface of the GaAs layer 24, and hence there are formed three drain electrodes 31. Further, the optical detector 20 has a source electrode on the bottom surface of the GaAs substrate 21.

Figure 3:
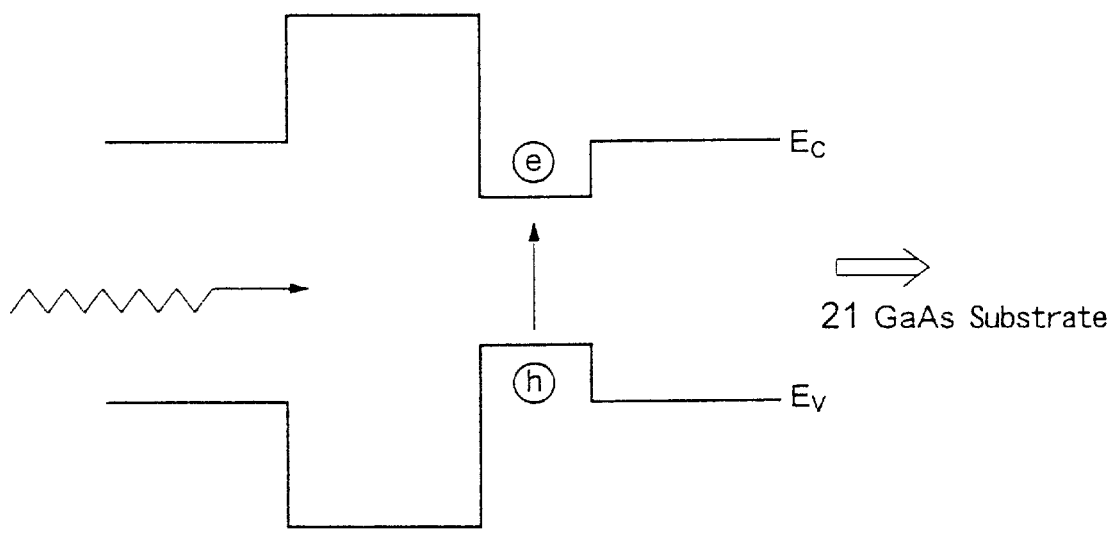
FIG. 3 is a band diagram explaining the principle of the optical detector of FIGS. 2A and 2B.

FIG. 3 shows the band structure of the optical detector 20 taken along a line drawn perpendicularly to the substrate 21 so as to include the apex 25B.

Referring to FIG. 3, an optical beam incident through the optical window 30 causes an optical excitation of electron-hole pairs in the channel layer 26, and there appear electrons e on the conduction band Ec and holes h on the valence band Ev. The electrons e and holes h thus excited are caused to flow through the channel layer 26 in opposite directions when a bias voltage is applied across the drain electrode 31 and the source electrode 32, and the holes h reach the drain electrode 31 through the channel layer 26. On the other hand, the electrons e reach the apex 25B through the channel layer 26, wherein the electrons thus reached the apex 25B travels further to the $n^+$-type GaAs layer 22 by way of thermal excitation and reach the source electrode 32 through the GaAs layer 22 and further through the substrate 21.

In the construction of FIGS. 2A and 2B, it should be noted that no optical excitation occurs in the cap layer 28 as the cap layer 28 is formed of GaAs having a larger bandgap as compared with the bandgap of InGaAs forming the channel layer 26.

In the optical detector 20 of such a construction, the electrons excited in the channel layer 26 are collected at the apex 25B of the etch-pit 25 through the channel layer 26, and it becomes possible to detect the optical current reliably even in such a case the incoming optical beam has a very feeble optical power.

FIGS. 4A–4F show the fabrication process of the optical detector 20 of the present embodiment.

Figure 4A:
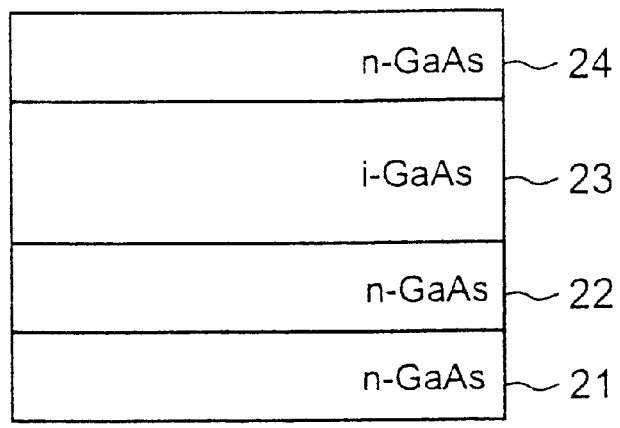
FIGS. 4A–4F are diagrams showing the fabrication process of the optical detector of the first embodiment.

Referring to FIG. 4A, the GaAs layer 22 of $n^+$-type and the undoped GaAs layer 23 and the GaAs layer 24 of the $n^+$-type are deposited consecutively on (111)B surface of the $n^+$-type GaAs substrate 21 by an MOVPE process with respective thicknesses of 0.1 μm, 0.3 μm and 0.1 μm.

Figure 4B:
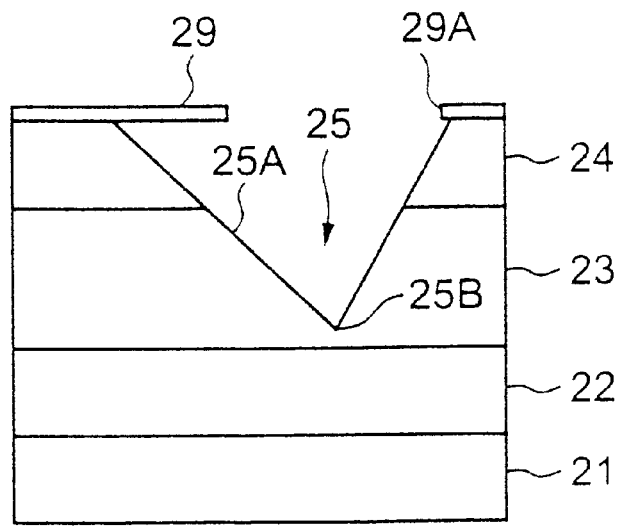
Figure 4C:
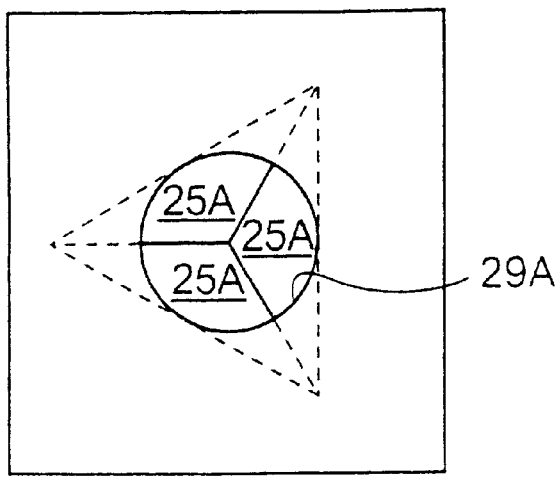

Next, in the steps of FIGS. 4B and 4C, the SiO$_2$ film 29 is formed on the GaAs layer 24 by a plasma CVD process with a thickness of typically 200 nm. Further, the circular opening 29A is formed in the SiO$_2$ film 29 with a diameter of 1 μm by a high-resolution lithographic process such as an electron-beam lithography, and the n+-GaAs layer 24 and the underlying undoped GaAs layer 23 are subjected to a wet etching process by using an etchant such as bromic methanol. It should be noted that FIG. 4C shows the plan view of FIG. 4B.

As a result of such a wet-etching process, the tetrahedral etch-pit 25 is formed in the GaAs layer 24 as represented in FIGS. 4B and 4C such that the tetrahedral etch-pit 25, defined by the three facets 25A each forming the (111)A surface, invades into the GaAs layer 23. Thereby, the three facets 25A merge together at the apex 25B wherein the location of the apex 25B can be controlled by controlling the diameter of the circular opening 29A such that the apex 25B is formed inside the undoped GaAs layer 23 in the vicinity of the interface to the underlying $n^+$-type GaAs layer 22.

In more detail, the wet etching process for forming the etch-pit 25 stops spontaneously when there is realized a relationship such that the circular opening 29A inscribes the triangle formed on the top surface of the $n^+$-type GaAs layer 24 in correspondence to the bottom opening of the tetrahedral etch-pit 25.

Figure 4D:
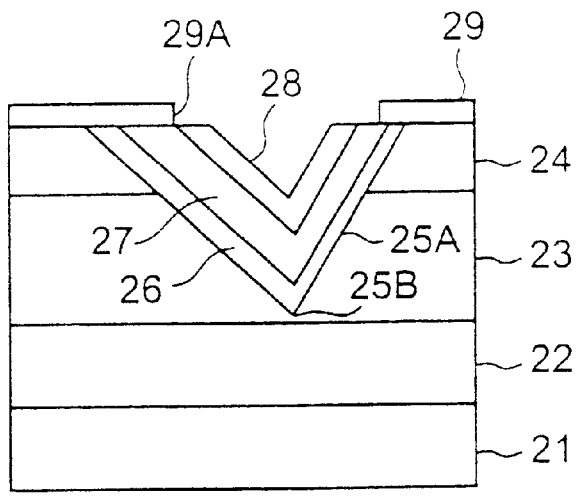

Next, in the step of FIG. 4D, the channel layer 26 of $n^+$-type InGaAs is formed in the etch-pit 25 such that the channel layer 26 covers the three facets 25A continuously including the apex 25B by an MOVPE process with a thickness of about 15 nm, and the undoped barrier layer 27 of AlGaAs and the undoped cap layer 28 of GaAs are deposited further thereon by an MOVPE process respectively with the thicknesses of 20 nm and 10 nm.

Figure 4E:
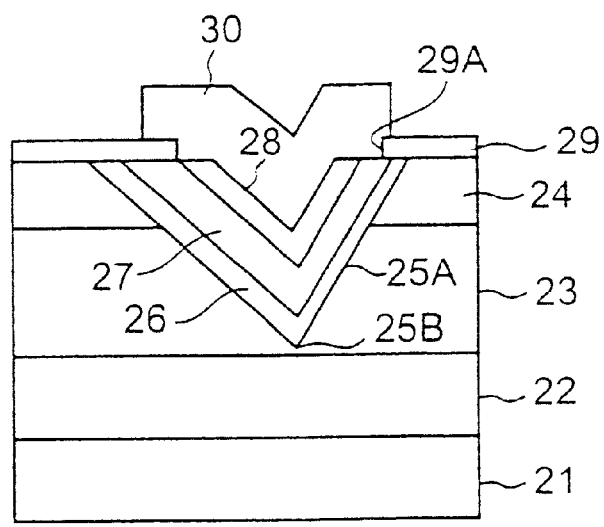
Figure 4F:
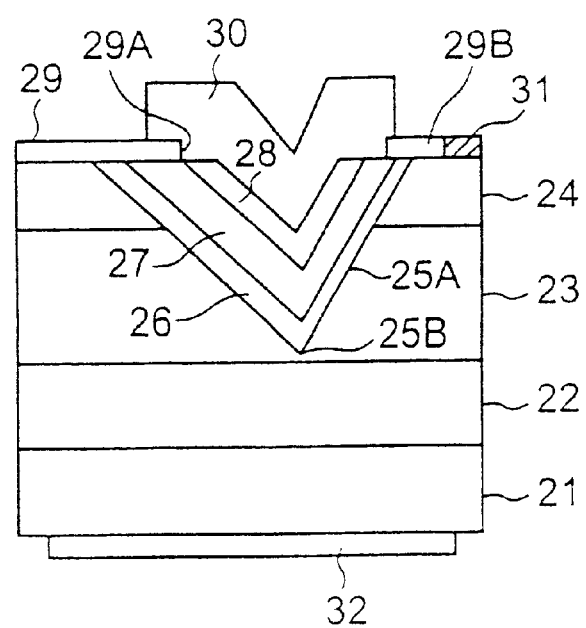

Next, in the step of FIG. 4E, an optical window 30 is formed on the structure of FIG. 4D in contact with the cap layer 28, and the drain electrode 31 is formed in the step of FIG. 4F in ohmic contact with the n$^+$-type GaAs layer 24 at the opening 29B formed in the SiO$_2$ film 29. Further, the source electrode 32 is formed on the bottom surface of the substrate 21 in ohmic contact therewith. Typically, the electrodes 31 and 32 are formed of a stacking of an AuGe layer and an Au layer with respective thicknesses of 50 nm and 200 nm, wherein the electrodes 31 and 32 form the desired ohmic contact after being annealed at 450° C. for 1 minute.

As such an etch-pit 25 can be formed on the substrate 21 repeatedly with predetermined pitch of repetition, the optical detector 20 of the present invention is suitable for constructing a photodetection array.

[Second Embodiment]

Figure 5:
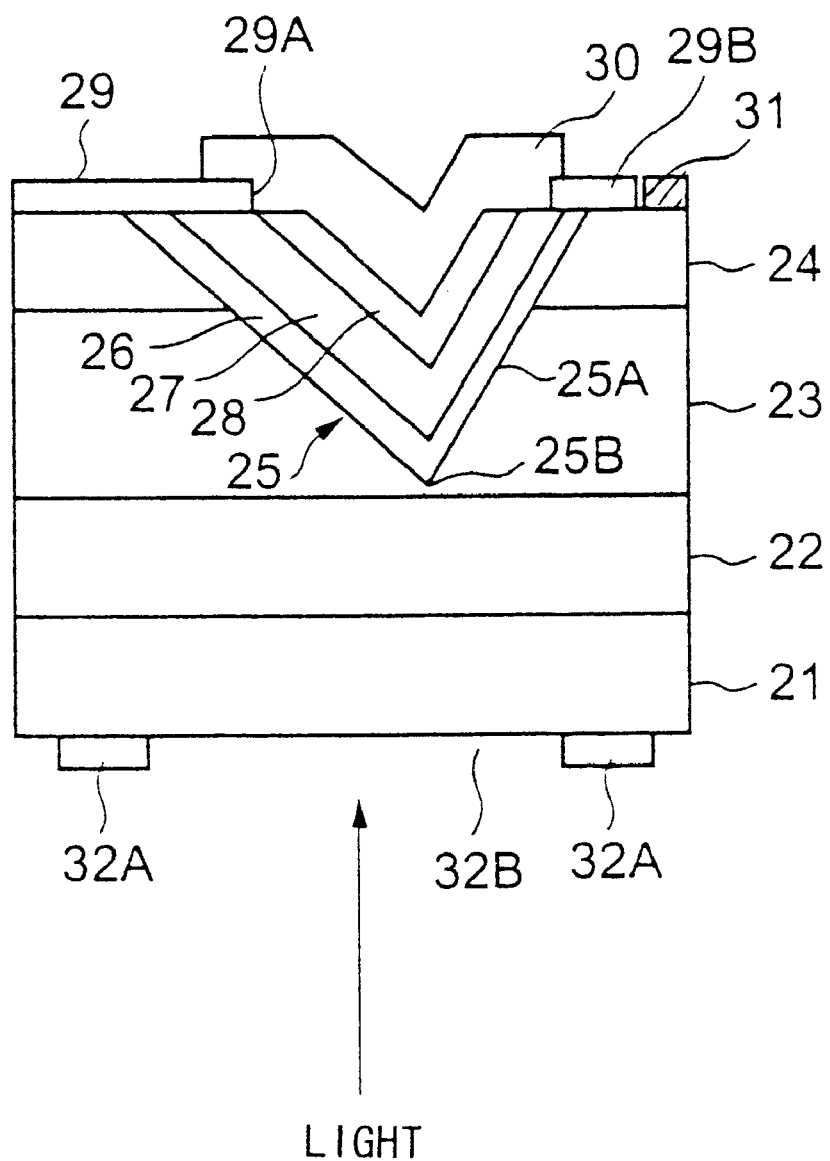
FIG. 5 is a diagram showing the construction of an optical detector according to a second embodiment of the present invention.

FIG. 5 shows the construction of an optical detector 20A according to a second embodiment of the present invention, wherein those parts corresponding to the parts described previously are designated by the same reference numerals and the description thereof will be omitted.

Referring to FIG. 5, the optical detector 20A has a construction similar to that of the optical detector 20 of the previous embodiment, except that there is provided an opaque pattern 30A such as a metal pattern in place of the optical window 30, and a ring-shaped electrode 32A having an optical window 32B is provided on the bottom surface of the substrate 31.

In the optical detector 20A of FIG. 6, it should be noted that the incident optical beam comes in from the bottom direction and enters at the optical window 32B. In such a construction, too, it is possible to excite the electron-hole pairs in the channel layer 26.

In the construction of FIG. 6, it is not necessary to form the pattern 30A by a metal such as Al, but the pattern 30A may be formed also by a transparent patterns such as SiO$_2$. In the event the pattern 30A is to be formed of SiO2, it is necessary to form the pattern 30A separately to the SiO2 film 29, as the SiO$_2$ film 29 is used as an etching mask at the time of formation of the etch-pit 25.

In the optical detector 20A, it is also possible to form an anti-reflective film in correspondence to the optical window 32B.

As other aspects of the present embodiment are substantially the same as those described previously, further description thereof will be omitted.

[Third Embodiment]

Figure 6A:
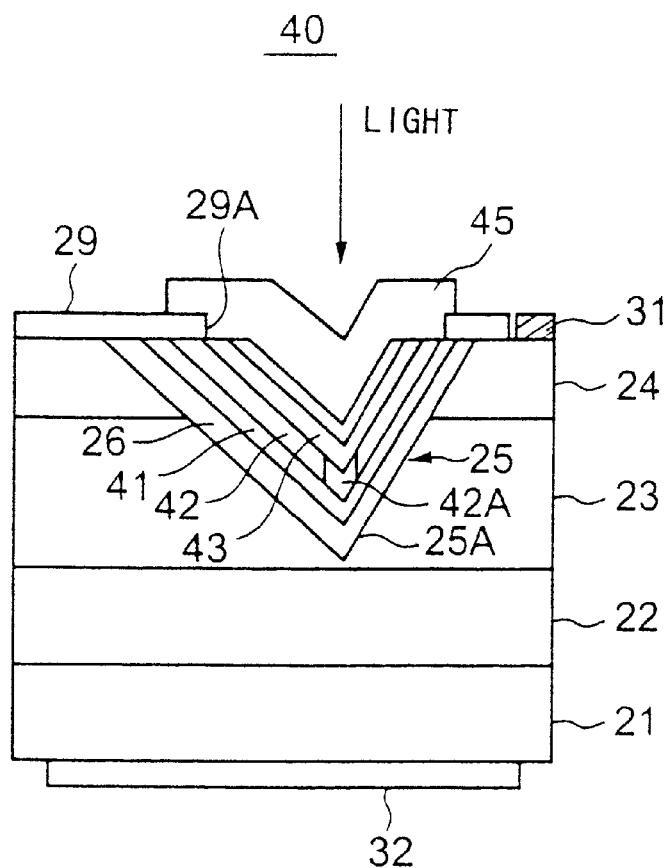
FIGS. 6A and 6B are diagrams showing the construction of an optical semiconductor memory device according to a third embodiment of the present invention.
Figure 6B:
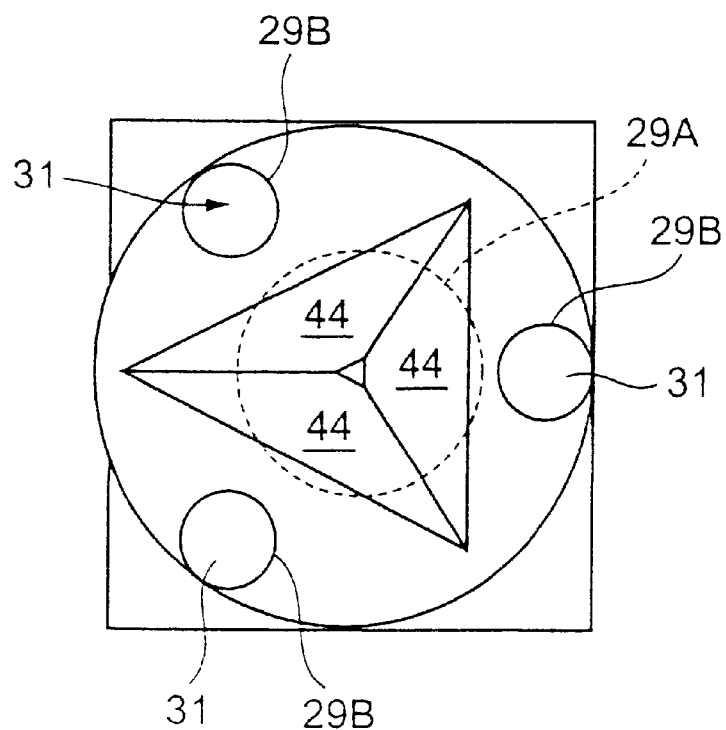

FIGS. 6A and 6B show the construction of an optical semiconductor memory device 40 according to a third embodiment of the present invention, wherein those parts corresponding to the parts described previously are designated by the same reference numerals and the description thereof will be omitted.

Referring to FIGS. 6A and 6B, the optical semiconductor memory device 40 of the present embodiment includes a first barrier layer 41 of C-doped, p-type AlGaAs in the etch-pit 25 so as to cover the channel layer 26 with a thickness of typically about 20 nm, and a hole accumulation layer 42 of undoped GaInAs is formed on the barrier layer 41 with a thickness of about 10 nm. Further, a second barrier layer 43 of C-doped, p-type AlGaAs is formed on the hole-accumulation layer 42 with a thickness of about 20 nm, and a cap layer 44 of n-type GaAs is formed on the barrier layer 43 with a thickness of about 10 nm.

In the present embodiment, a transparent electrode pattern 45 of ITO (In$_2$O$_3$.TiO$_2$) is formed on the cap layer 44, wherein the transparent electrode pattern 45 functions also as an optical window.

In the hole-accumulation layer 42 of such a construction, there occurs a concentration of In in the apex part located in the vicinity of the apex 25B of the etch-pit 25, while such a concentration of In forms a quantum dot 42A in such a part due to the decrease of the bandgap caused by such a concentration of In. Reference should be made to the U.S. Pat. No. 5,656,821 with regard to the phenomenon of In concentration in an etch-pit and associated quantum dot formation.

FIG. 7 shows the band structure of the optical semiconductor memory device 40 of the present embodiment, wherein it should noted that the band structure of FIG. 7 is taken along a line drawn perpendicularly to the substrate 21 so as to pass the apex 25B.

Referring to FIG. 7, it can be seen that the conduction band Ec and the valence band Ev of the barrier layers 41 and 43 are shifted in the higher energy side with regard to the conduction band Ec and the valence band Ev of the channel layer 26 or the cap layer 44 due to the existence of a p-n junction formed at the interface between the n-type InGaAs channel layer 26 and the p-type AlGaAs barrier layer 41 and at the interface between the n-type GaAs cap layer 44 and the p-type AlGaAs barrier layer 43.

Further, it can be seen that there is formed a quantum dot characterized by quantum levels Le and Lh in the hole-accumulation layer 42 sandwiched between the barrier layers 41 and 43 in correspondence to the part 42A located in the vicinity of the apex 25B of the etch-pit 25. Thus, there is caused an excitation of electron-hole pairs e and h in the quantum dot in response to the irradiation of an incoming optical beam through the optical window 45.

Thus, when a suitable bias voltage is applied across the drain electrode 31 and the source electrode 32, the optically excited electrons e fall into the channel layer 26 after overriding the barrier layer 41 and the electrons e are transported through the channel layer 26 to the apex 25B of the etch-pit 25. The electrons e thus reached the apex 25B further cause a transit through the undoped GaAs layer 23 by thermal excitation to the n$^+$-type layer 22, and the electrons e thus reached the n$^+$-type layer 22 are transported through the substrate 21 and absorbed by the electrode 32.

Meanwhile, the holes thus excited optically are held stably in the quantum dot 42A, and thus, there occurs an accumulation of holes in the quantum dot 42A. Thus, the optical semiconductor memory device 40 of the present embodiment enables an optical writing of information through the optical window 45.

When an optical writing is made in such an optical semiconductor memory device 40, the conduction band Ec and the valence band Ev of the quantum dot 42A undergo a shifting in the lower energy side with the accumulation of holes h in the quantum dot 42A. Associated with such a change of the band structure, the conduction band Ec and the valence band Ec of the channel layer 26, which is in thermal equilibrium with the quantum dot 42A, also undergo a shifting in the lower energy side. As a result of such a change of the band structure, the carrier density in the channel layer 26 increases and the electric current observed between the drain electrode 31 and the source electrode 32 increases. In other words, it is possible to read out the information held in the quantum dot 42A, in such an optical semiconductor memory device 40, by detecting the electric current flowing between the drain electrode 31 and the source electrode 32.

In the optical semiconductor memory device 40 of the present embodiment, it is possible to erase the information held in the quantum dot 42A, in the case the optical window 45 is formed of a transparent conductive pattern, by injecting electrons into the quantum dot 42A via the conductive optical window 45.

More specifically, it is possible to inject electrons into the hole-accumulation layer 42 and particularly into the quantum dot 42A via the conduction band Ec of the cap layer 44, by elevating the potential of the transparent electrode pattern constituting the optical window 45. The electrons thus injected cause a recombination with the holes immediately, and the erasing of information is achieved as a result.

Figure 8:
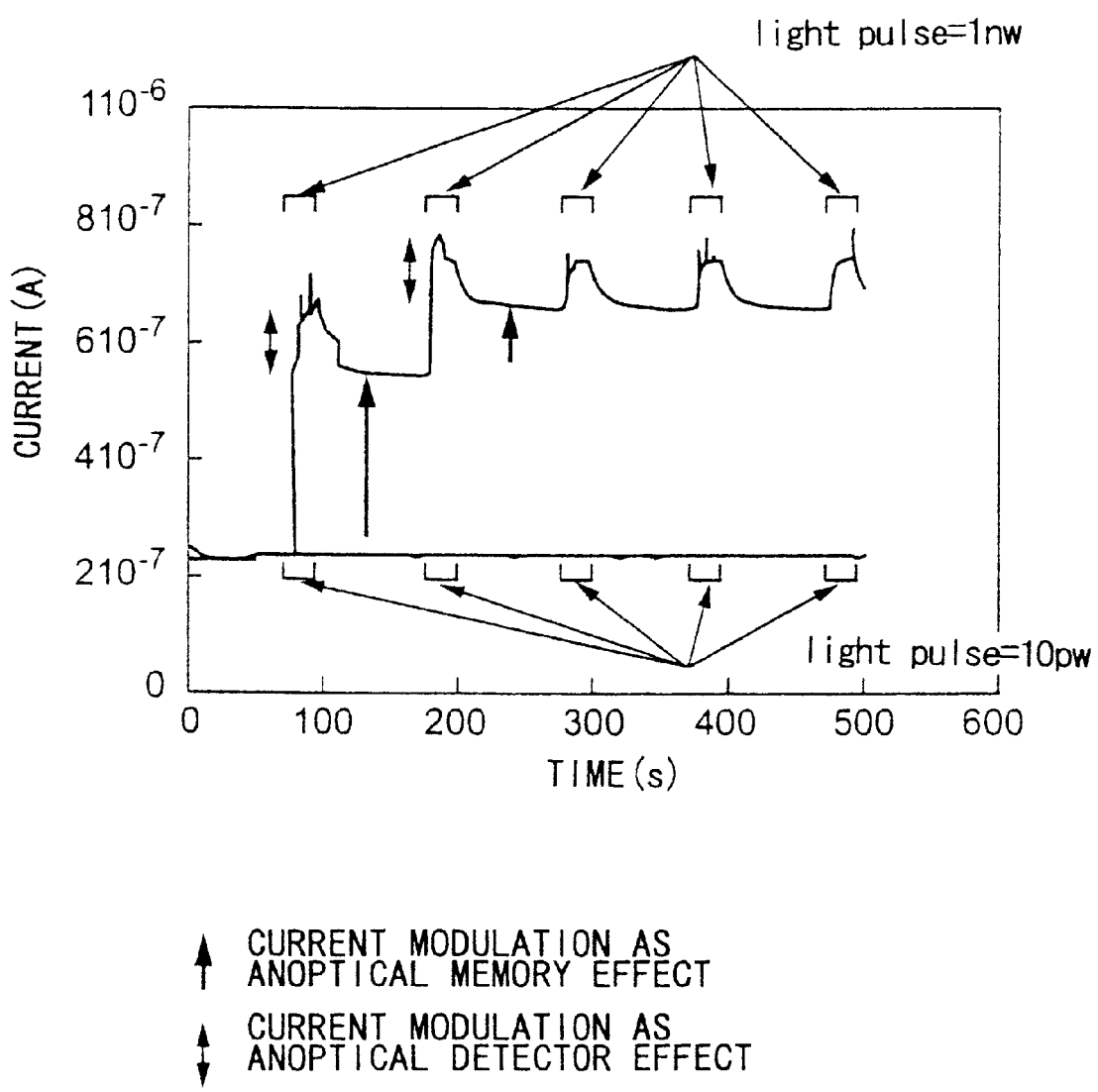
FIG. 8 is a diagram showing the optical memory effect achieved by the optical semiconductor memory device of FIGS. 6A and 6B.

FIG. 8 shows the photocurrent observed in the optical semiconductor memory device 40 between the electrodes 31 and 32 for the case an optical beam having an optical power of 1 pW or 1 nW is injected through the optical window 45.

Referring to FIG. 8, no substantial change of photocurrent is observed in the case the incident optical beam has an optical power of 1 pW, while in the case the optical beam has an optical power of 1 nW, it can be seen that there occurs a stepwise increase of photocurrent in response to irradiation of the optical pulse. Further, it can be seen that such a stepwise change of the photocurrent is maintained even after the incident optical beam is shut down, indicating that there occurs a stable accumulation of holes in the quantum dot 42A. The result of FIG. 8 demonstrates that the device 40 of the present embodiment in fact functions as an optical memory device.

Further, the temporary increase of the photocurrent observed in FIG. 8 for each of the steps indicates the excitation of the electron-hole pairs taking place in the channel layer 26 in response to irradiation of the optical beam, similarly to the case of the optical detector 20 of the previous embodiment. Thus, it can be seen that that optical semiconductor memory device 40 of the present embodiment functions also as an optical detector. Further, the result of FIG. 8 also demonstrates that the optical detector 20 of the previous embodiment also functions as a high-sensitivity optical detector.

Next, the fabrication process of the optical semiconductor device 40 of the present embodiment will be described with reference to FIGS. 9A–9E.

Figure 9A:
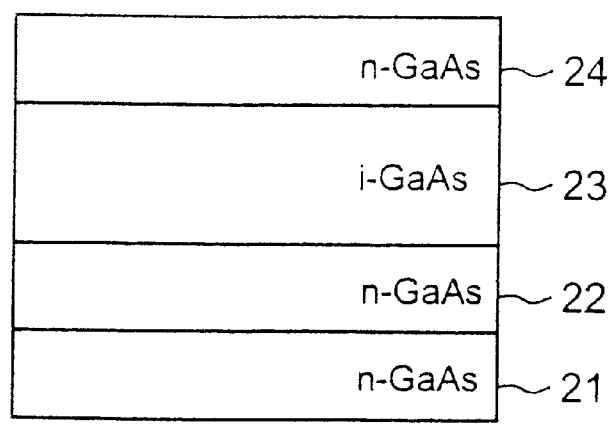
FIGS. 9A–9E are diagrams showing the fabrication process of the optical semiconductor memory device of the third embodiment.
Figure 9B:
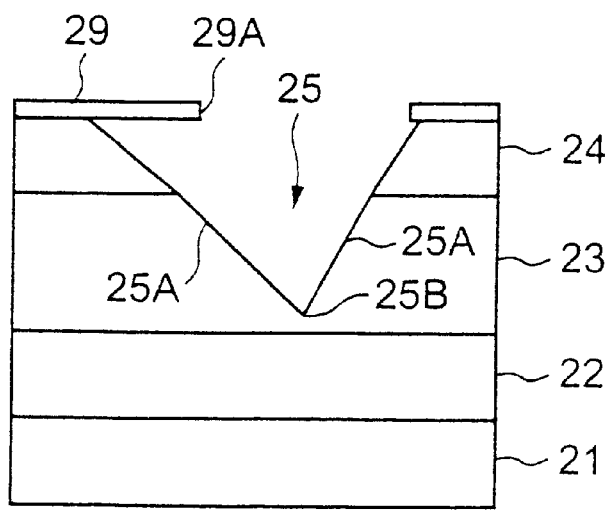

Referring to FIGS. 9A and 9B corresponding to the steps of FIGS. 4A and 4B, the tetrahedral etch-pit 25 defined by the facets 25A and having the apex 25B is formed in the GaAs layers 22–24 formed on the GaAs substrate 21 such that the apex 25B is located in the undoped GaAs layer 23 in the vicinity of the interface to the n$^+$-type GaAs layer 22, by using the SiO2 film 29 having the opening 29A as a mask.

Figure 9C:
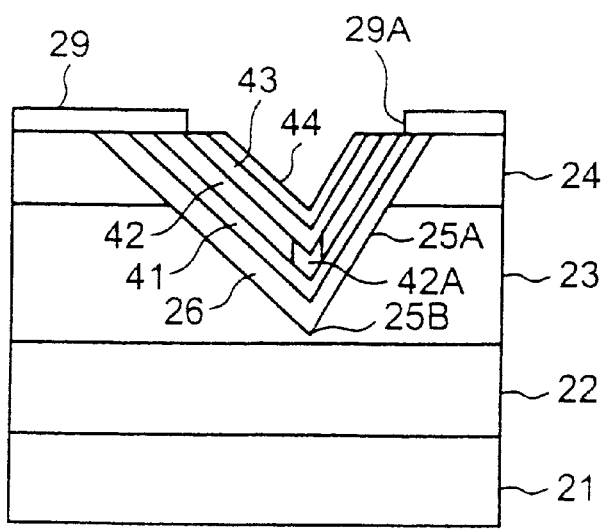

Next, in the step of FIG. 9C, the channel layer 26 is formed in the etch-pit 25 by an MOVPE process so as to cover the channel layer 26 with a thickness of about 15 nm, and the barrier layer 41, the hole-accumulation layer 42, the barrier layer 43 and the cap layer 44 are deposited consecutively by an MOVPE process with respective thickensses of 20 nm, 20 nm and 10 nm. As explained previously, the channel layer 26 is formed of InGaAs and is doped to the n-type with Se to a carrier density of $1 \times 10^{18}$ cm$^{-3}$. On the other hand, the cap layer 44 is formed of GaAs and is doped to the n-type by Se with the carrier density of $1 \times 10^{18}$ cm$^{-3}$.

Figure 9D:
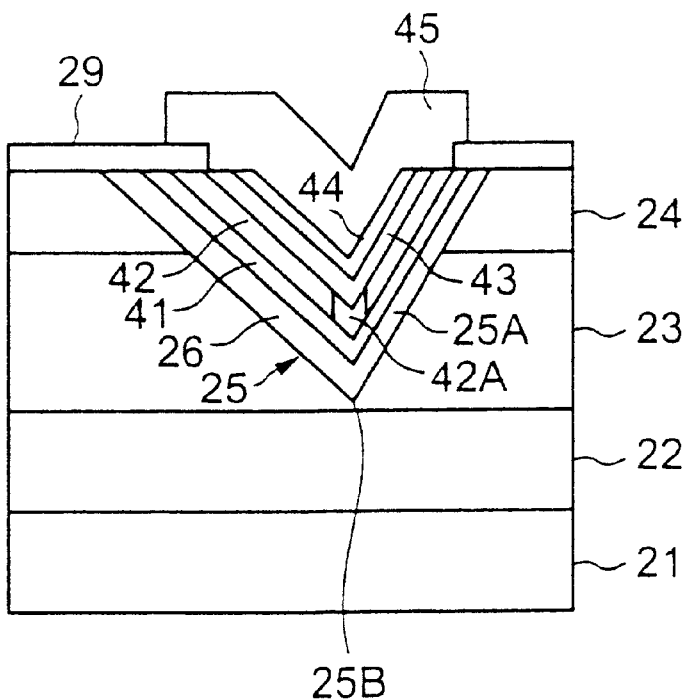
Figure 9E:
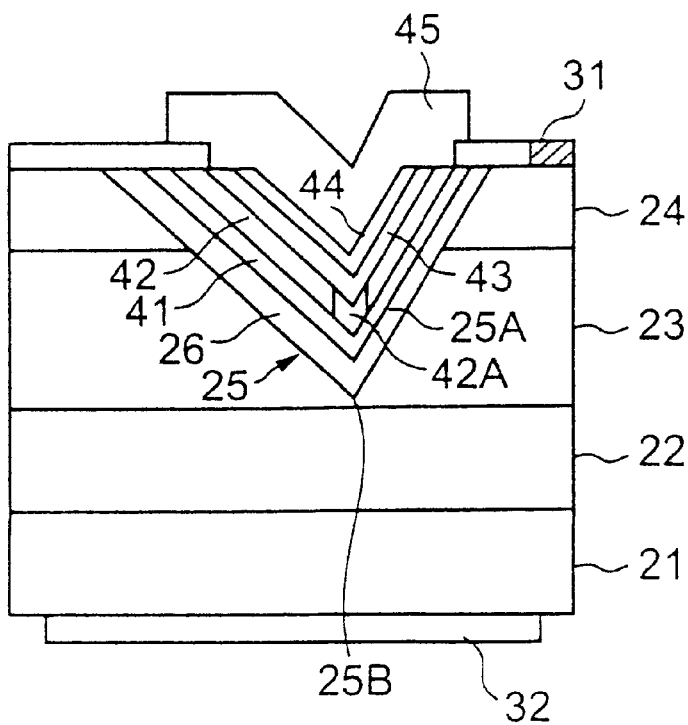

Next, in the step of FIG. 9D, the ITO pattern 45 is formed in electric contact with the cap layer 44, and the drain electrodes 31 and the source electrode 32 are formed in the step of FIG. 9E.

In the present embodiment, it should be noted that it is not always necessary that the quantum dot 42A is formed in the hole-accumulation layer 42 in the present invention and that the present invention is effective also in the case the hole-accumulation layer 42 forms a simple potential well or ordinary quantum well. It is, however, advantageous to form the quantum dot 42A in the hole-accumulation layer 42 in the vicinity of the apex 25B in order that the effect of the band energy change, caused by the accumulation of the holes, appear clearly in the electric current detected at the electrodes 31 and 32.

As the etch-pit 25 can be formed on the substrate 21 repeatedly with a predetermined pitch, the present invention is suitable for constructing a large-scale memory integrated circuit by using a large number of the optical semiconductor memory devices 40.

[Fourth Embodiment]

Figure 10:
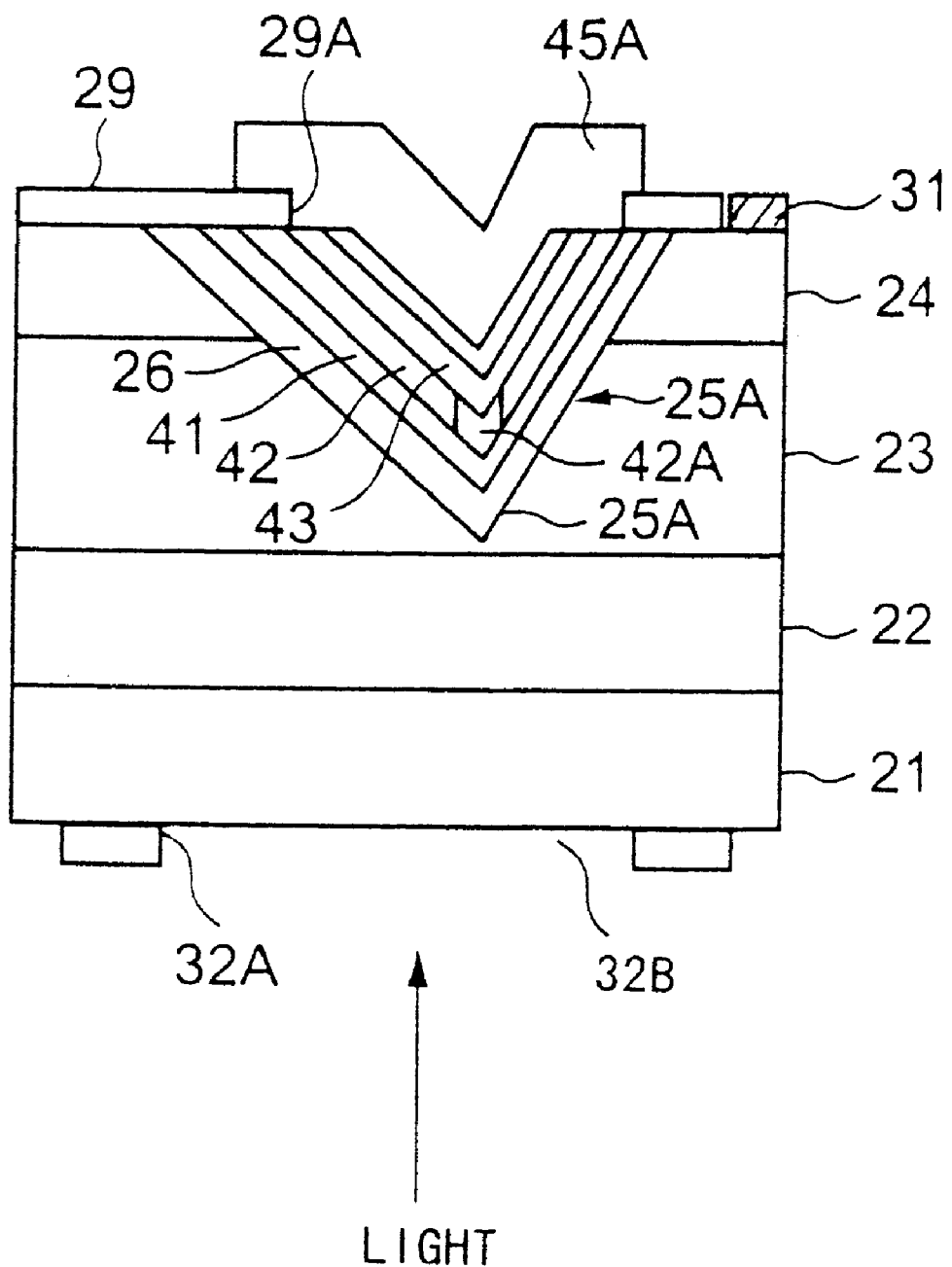
FIG. 10 is a diagram showing the construction of an optical semiconductor memory device according to a fourth embodiment of the present invention.

FIG. 10 shows the construction of an optical semiconductor memory device 40A according to a fourth embodiment of the present invention, wherein those parts corresponding to the parts described previously are designated by the same reference numerals and the description thereof will be omitted.

Referring to FIG. 10, the optical semiconductor memory device 40A of the present embodiment has a construction similar to that of the optical semiconductor memory device 40 of the previous embodiment, except that a metal electrode 45A such as Al is provided in place of the transparent electrode pattern 45 and that the ring-shaped electrode 32A having the optical window 32B explained with reference to the embodiment of FIG. 5 is provided in place of the electrode 32.

In the construction of FIG. 10, the writing optical beam is introduced into the bottom principal surface of the GaAs substrate 21 through the optical window 32B and causes an optical excitation of the electrons and holes in the quantum dot 42A in the hole-accumulation layer 42 according to the mechanism explained with reference to FIG. 7.

In the present embodiment, it should be noted that the electrode 45A is not limited to a metal but may be formed of a transparent oxide conductor such as ITO.

As other aspects of the present embodiment are substantially the same as those of the previously embodiments, further description thereof will be omitted.

[Fifth Embodiment]

FIG. 13 shows the construction of an optical semiconductor memory device 50 according to a fifth embodiment of the present invention, wherein those parts corresponding to the parts described previously are designated by the same reference numerals and the description thereof will be omitted.

In the present embodiment, a barrier layer 51 of AlGaAs doped with C to the p-type is provided on the n$^+$-type InGaAs channel layer 26 covering the facets 25A in the tetrahedral etch-pit 25, and the an InGaAs region 52 constituting a quantum dot is formed in the barrier layer 51 selectively in the vicinity of the apex 25B of the etch-pit 25.

The InGaAs, region 52 is further covered with a p-type AlGaAs barrier layer 52 doped with C, and a cap layer 44 of n-type GaAs is formed on the barrier layer 53. In such a construction, the barrier layer 53 continues to the barrier layer 51 except for the part where the InGaAs region 52 is formed and forms substantially a single barrier layer.

Figure 11:
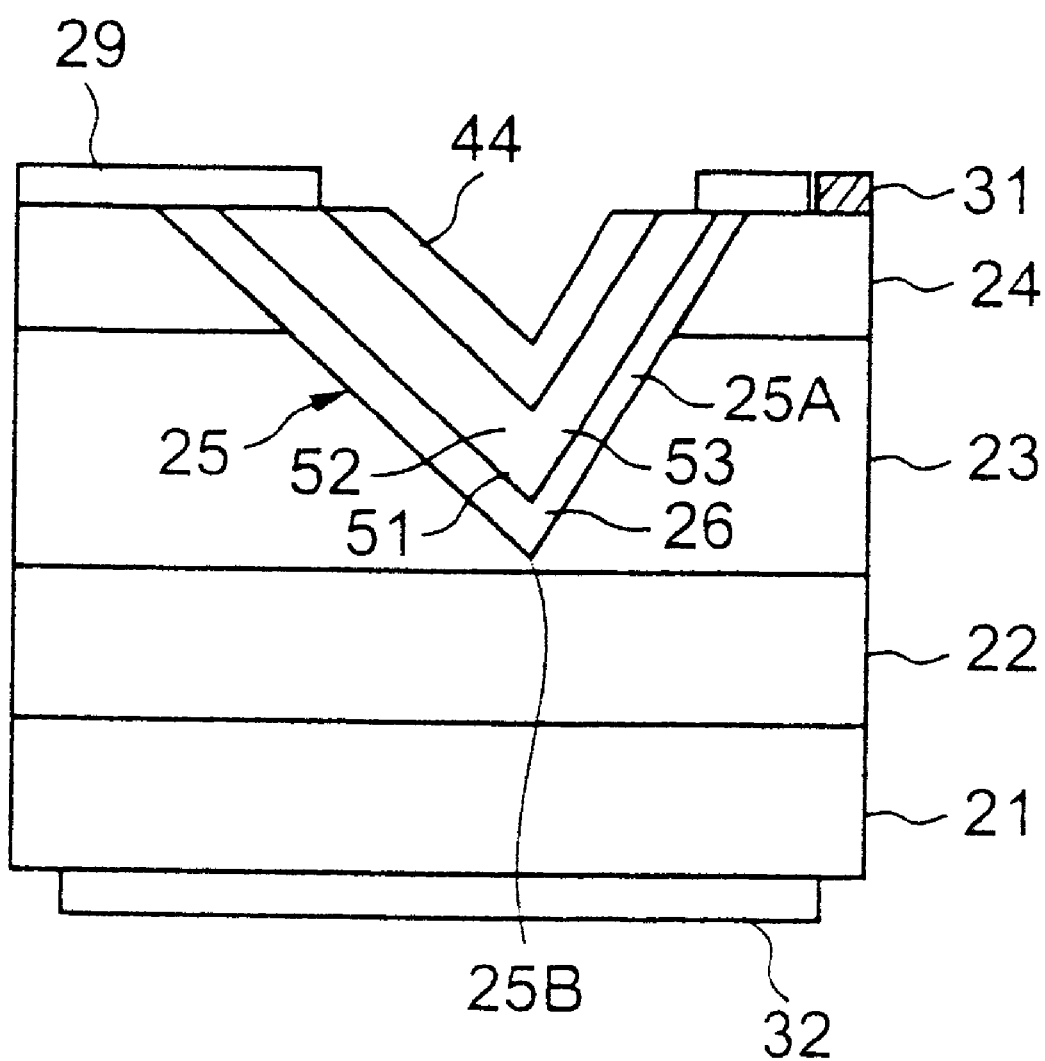
FIG. 11 is a diagram showing the construction of an optical semiconductor memory device according to a fifth embodiment of the present invention.

The construction of FIG. 11 functions also as an optical memory as explained with reference to FIG. 7.

The InGaAs region 52 can be formed selectively in the vicinity of the apex 25B by conducting an MOVPE process such that TMIn (trimethyl indium), TMGa (trimethyl Gallium) and AsH$_3$ are supplied alternately as the source of In, Ga and As, with an interval of 1 second. In the case TMIn, TMGa and AsH3 are supplied simultaneously, a uniform layer of InGaAs is formed on the (111)A facets 25A.

It should be noted that the optical detector or optical semiconductor memory device of the present invention is by no means limited to a GaAs/InGaAs system but may be constructed based on other III–V systems.

Further, it is possible to use an n-type Si substrate for the substrate 21. In this case, the layers 22 and 24 are formed of an n-type Si layer and the layer 23 is formed of an i-type Si layer. Further, it is possible to form the layers 41–44 by using a mixed crystal of SiGeC. In this case, the etch-pit 25 formed in the semiconductor layers 23 and 23 is not a tetrahedron but takes a form of an inverted pyramid having a right square form at the bottom surface.

[Sixth Embodiment]

Figure 12A:
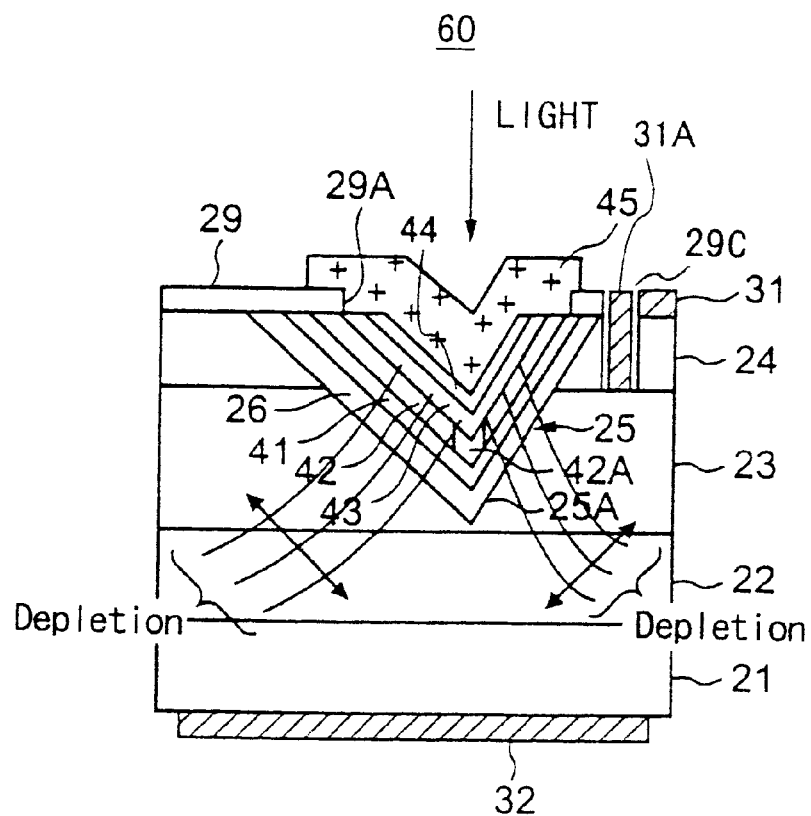
FIGS. 12A and 12B are diagrams showing the construction of an optical detector according to a sixth embodiment of the present invention.
Figure 12B:
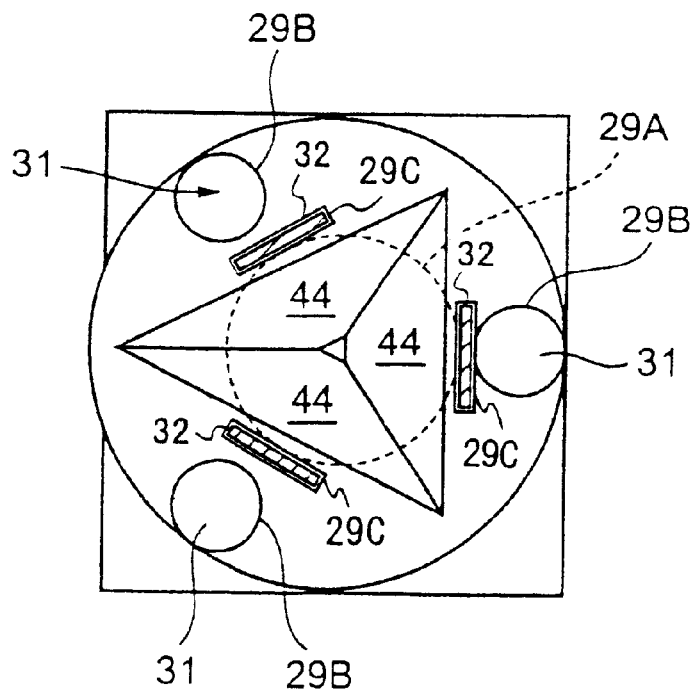

FIGS. 12A and 12B show the construction of an optical detector 60 according to a sixth embodiment of the present invention, wherein those parts corresponding to the parts described previously are designated by the same reference numerals and the description thereof will be omitted.

Referring to FIGS. 12A and 12B, the optical detector 60 has a construction similar to that of the optical detector 40 of FIGS. 6A and 6B except that a contact hole 29C is formed in the $SiO_2$ film 29 in correspondence to each edge of the triangular opening of the etch-pit 25 such that the contact hole 29C penetrates through the underlying $n^+$-type GaAs layer 24 and exposes the undoped GaAs layer 23. Further, a Schottky electrode 31A of Al or W is formed in the contact hole 29C in Schottky contact with the GaAs layer 23.

By providing such a Schottky electrode 31A and applying a control voltage thereto, it becomes possible to control the extension of a depletion region formed in the GaAs layer 23 as a result of the Schottky contact as represented in FIG. 12A by arrows, wherein it can be seen that the depletion region penetrates into the hole-accumulation layer 44, and the effective size of the quantum dot 42A formed in the hole-accumulation layer 44 is controlled in response to the extension of the depletion region. When the effective size of the quantum dot 42A is thus changed in response to the control voltage applied to the control electrodes 31A, the quantum levels Le and Lh of electrons and holes formed in the quantum dot 42A (see the band structure of FIG. 7) are changed accordingly.

Thus, in the optical detector 60 of the present embodiment, it is possible to tune the quantum dot 42A to the wavelength of the optical beam to be detected. By using such a tunable optical detector 60, it becomes possible to selectively detect an optical signal of a desired channel from a wavelength-multiplexed optical signal transmitted through an optical fiber.

By providing the Schottky electrodes 31A symmetrically with respect to the tetrahedral etch-pit 25, it is possible to change the size of the quantum dot 42A while maintaining the symmetry thereof. Thereby, splitting of the quantum levels Le and Lh into a number of sub quantum levels is avoided. Further, it is also possible to intentionally cause a splitting in the quantum levels Le and Lh by applying different control voltages to the electrodes 31A.

Similarly to the embodiment of FIGS. 6A and 6B, the optical detector 60 of the present invention functions also as an optical semiconductor memory device and provides a response to an incoming optical signal as represented in FIG. 8.

FIGS. 13A–13E show the fabrication process of the optical detector 60 of the present embodiment.

Figure 13A:
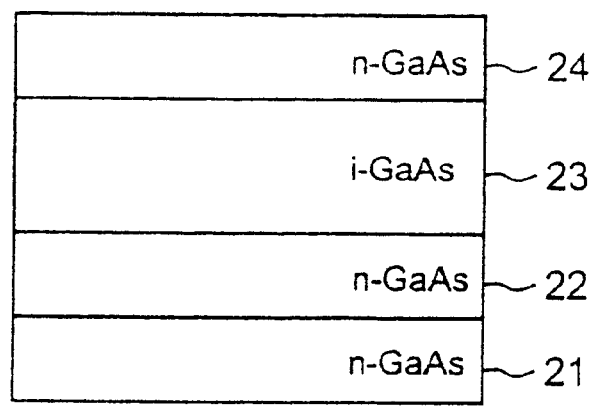
FIGS. 13A–13E are diagrams showing the fabrication process of the optical detector of the sixth embodiment.
Figure 13B:
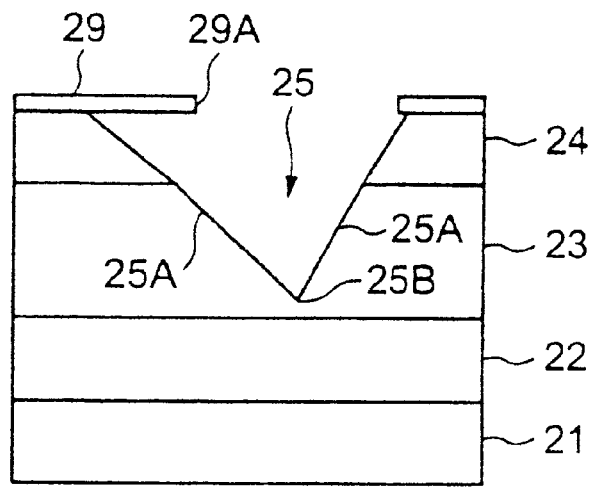
Figure 13C:
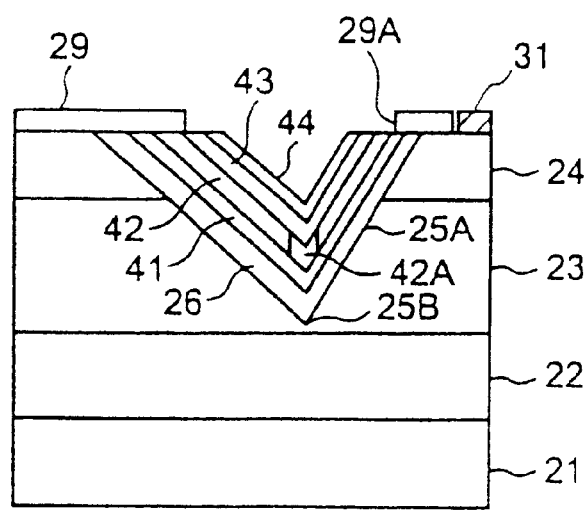

Referring to the drawings, the process is similar to the process of fabricating the optical semiconductor memory device 40 of FIGS. 9A–9E, and thus, the process of FIGS. 13A–13C correspond to the process of FIGS. 9A–9C, except that the source electrode 31 is formed already in the step of FIG. 13C.

Figure 13D:
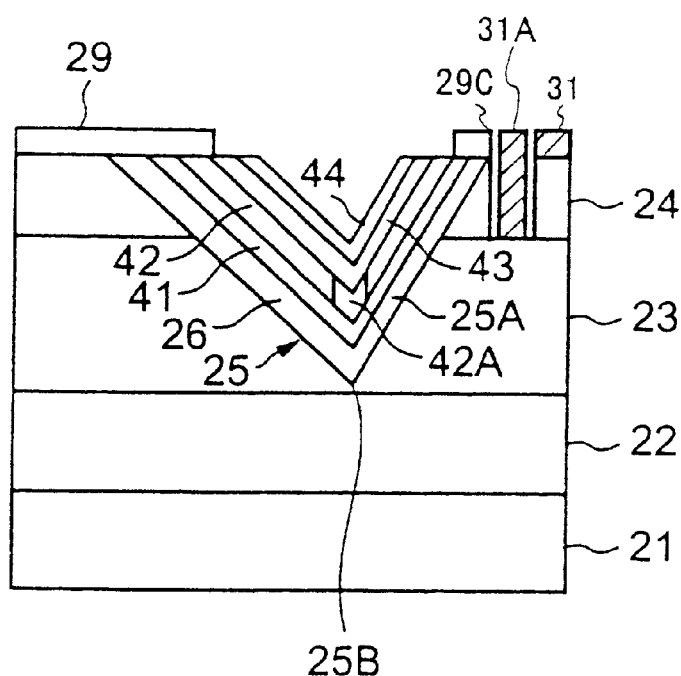
Figure 13E:
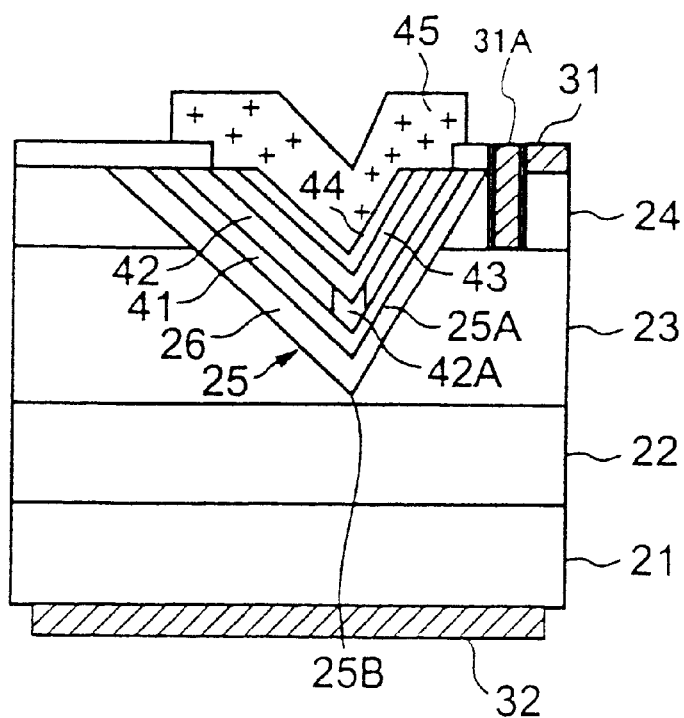

Next, in the step of FIG. 13D, the drain electrode 31 is formed in the opening 29B formed in the $SiO_2$ film 29 by a lift-off process, and the control electrode 31A is formed in the contact hole 29C formed in the SiO2 film 29, also by a lift-off process.

Further, the ITO electrode 45 is formed on the structure of FIG. 13D by a deposition of an ITO film, followed by a patterning process thereof

[Seventh Embodiment]

FIG. 14 shows the construction of an optical receiver 100 of a wavelength-multiplexed optical signal that uses the optical detector 60 of FIGS. 12A and 12B according to a seventh embodiment of the present invention.

Referring to FIG. 14, the optical receiver 100 is supplied with a wavelength-multiplexed optical signal including optical signal components having wavelengths $\lambda_1, \lambda_2, \ldots,$ wherein the incident wavelength-multiplexed optical signal is directed to the optical detector 60 described before. Thereby, the optical detector 60 is biased by a d.c. biasing voltage source 101 such that the d.c. bias voltage of the voltage source 101 is applied across the drain and source electrodes 31 and 32 via a current detector 102. Further, a control voltage is applied to the control electrode 31A by a variable d.c. voltage source 105 connected across the electrodes 31A and 32.

Thus, in the optical receiver 100 of FIG. 14, it is possible to detect the desired optical signal component selectively by the current detector 102, by tuning the effective size of the quantum dot 42A by way of control of the control voltage.

It should be noted that the current detector 102 supplies the output signal thereof to a signal processing circuit 102A, while the signal processing circuit 102A extracts the electric signal corresponding to the optical signal component from the output signal of the current detector 102. The signal processing circuit 102A further extracts a clock signal from the output signal of the current detector 102 and controls a reset switch 104 in response to the clock signal thus extracted. The reset switch 104 controls the application of a reset voltage produced by a reset voltage source 103 to the transparent electrode pattern 45. When closed, the reset switch 104 applies the reset voltage to the electrode 45, and the accumulation of holes caused in the quantum dot 42A is eliminated by the injection of electrons into the quantum dot 42A from the electrode 45.

Thus, the optical receiver 100 of the present embodiment can detect an arbitrary optical signal component in an incoming wavelength-multiplexed optical signal at a high-speed.

In the construction of FIG. 7, it should be noted that the reset voltage source 103 and the reset switch 104 may be realized by a pulse generator that is driven by the clock signal from the signal processing circuit 102A.

Further, the construction of FIG. 7 can be uses also as an optical memory device that uses the quantum dot 42A as the information recording medium, without any modification.

[Eighth Embodiment]

Figure 15A:
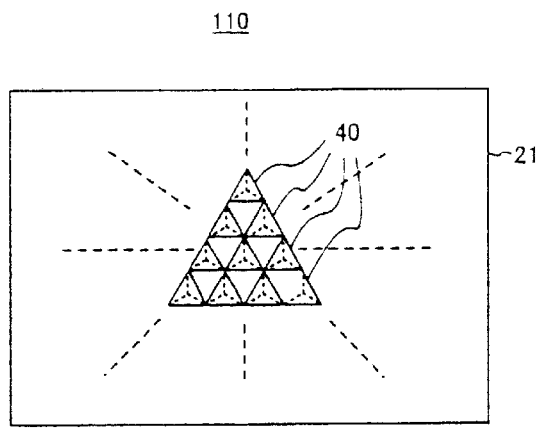
FIGS. 15A and 15B are diagrams showing the construction of a spectrum analyzer according to an eighth embodiment of the present invention.
Figure 15B:
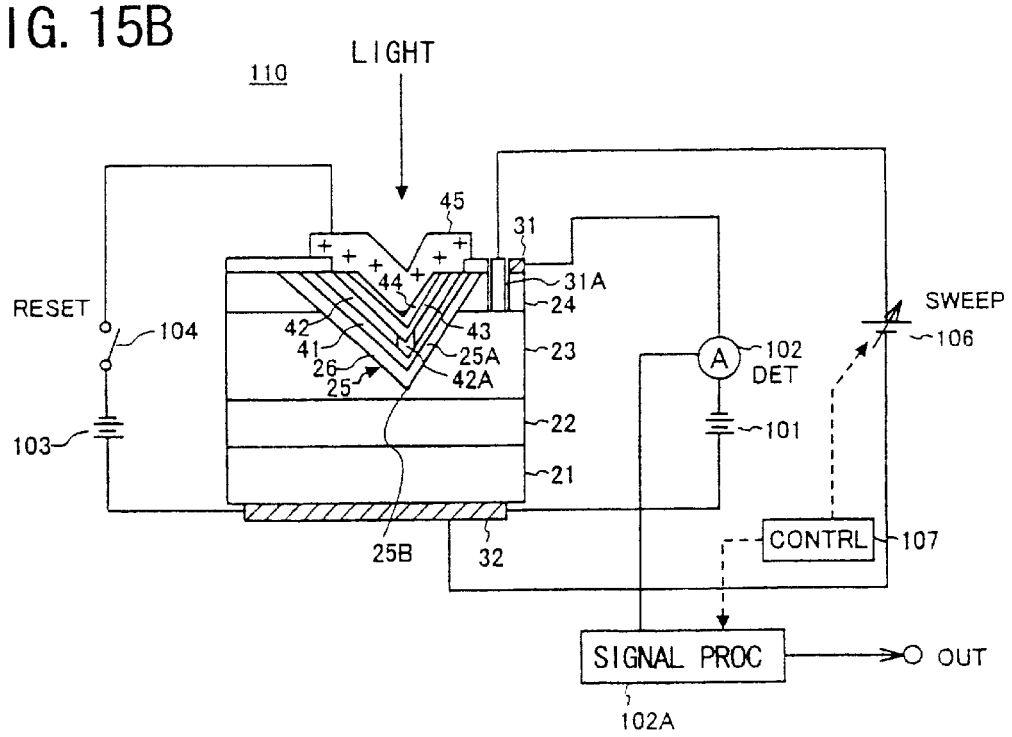

FIGS. 15A and 15B show the construction of a spectrum analyzer 110 that uses the optical detector 60 of FIGS. 12A and 12B according to an eighth embodiment of the present invention, wherein those parts corresponding to the parts described previously are designated by the same reference numerals and the description thereof will be omitted.

Referring to FIG. 15A, a number of pyramidal etch-pits 25 are formed on the substrate 21, wherein each of the etch-pits 25 form the optical detector 60, and there is formed an array of optical detectors 60 on the substrate 21.

As represented in FIG. 15B, each of the optical detectors 60 is biased by the d.c. biasing voltage source 101 similarly to the optical receiver 100 and the current detector 102 detects the photocurrent. Further, a common control voltage is applied to the control electrode 31A of each of the optical detectors 60, and a common reset voltage is applied to the transparent electrode pattern 45 of each of the optical detectors 60 via the reset switch 104.

In the construction of FIG. 15B, the spectrum analyzer 110 further includes a controller 107, wherein the controller initializes the optical detectors 60 by controlling the reset switch 104 before commencing measurement of spectrum.

Figure 16:
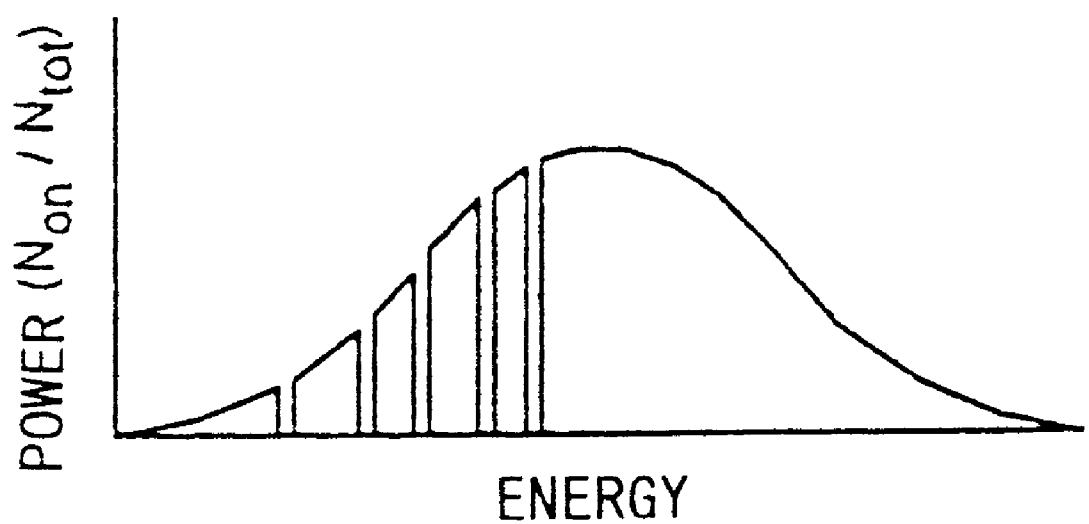
FIG. 16 is a diagram showing an output of the spectrum analyzer of FIGS. 15A and 15B.

Further, the controller 107 controls the variable voltage source 106 so as to sweep the control voltage and simultaneously controls the signal processing circuit 102A. As a result, the signal processing circuit 102A counts the number $N_{on}$ of the optical detectors 60 in the array that have produced an output photocurrent for each control voltage, and hence for each wavelength energy, based on the output of the current detector 102 and produces an output indicative of the ratio of the number $N_{on}$ to the total number $N_{tot}$ of the optical detectors 60 in the array. Thus, the signal processing circuit 102A produces an output indicative of the energy spectrum of the incoming optical signal as represented in FIG. 16.

[Ninth Embodiment]

Figure 17:
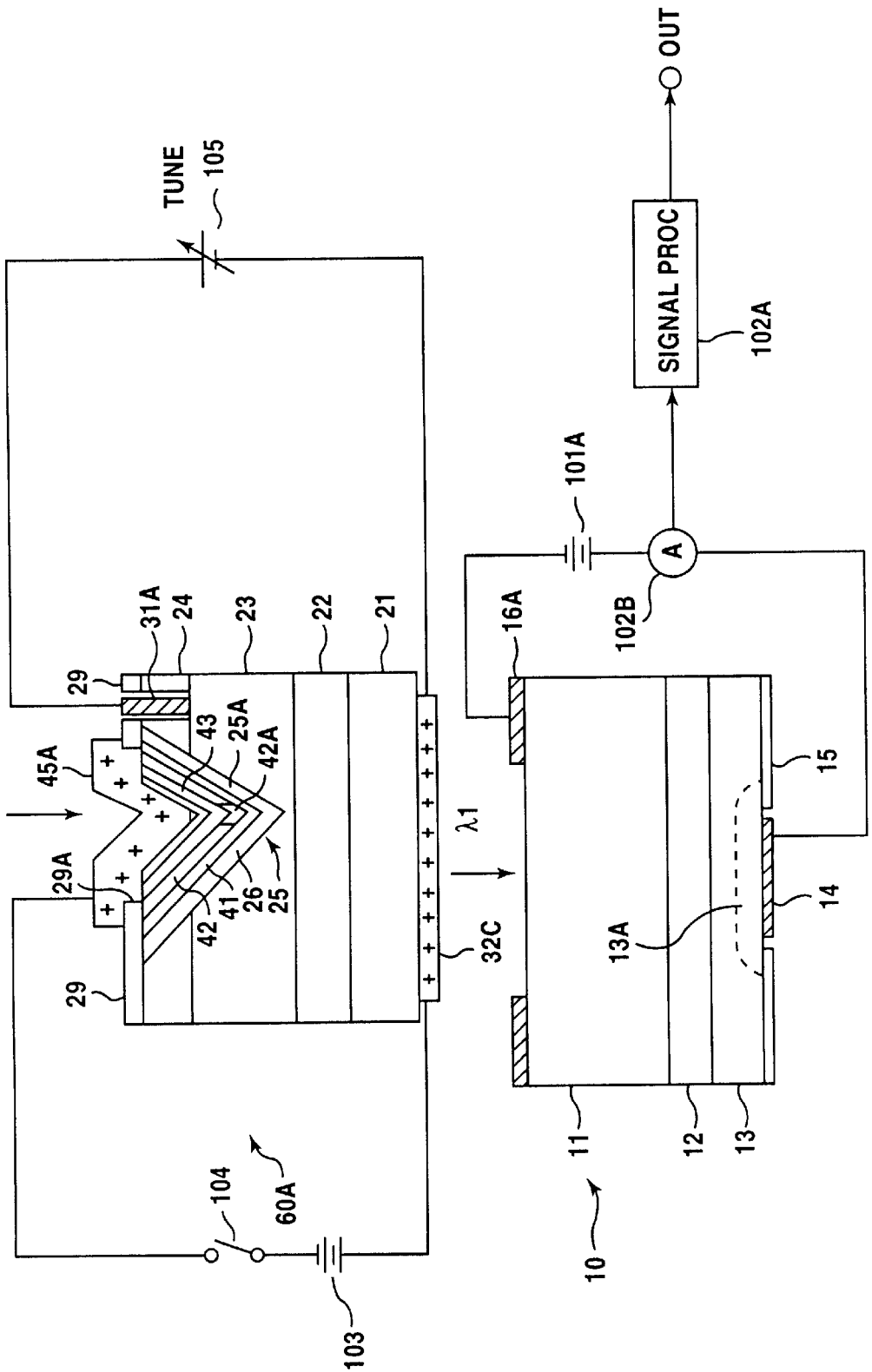
FIG. 17 is a diagram showing the construction of an optical receiver of wavelength-multiplexed optical signals according to a ninth embodiment of the present invention.

FIG. 17 shows the construction of a multiple-wavelength optical receiver 120 according to a ninth embodiment of the present invention, wherein those parts corresponding to the parts described previously are designated by the same reference numerals and the description thereof will be omitted.

Referring to FIG. 17, the optical receiver 120 of the present embodiment uses a variable-wavelength filter 60A, wherein the variable-wavelength filter 60A has a construction similar to that of the optical detector 60 except that the source electrode 32 is replaced with a transparent electrode 32C. In the optical receiver 120, too, a large number of the filters 60A may be formed on the substrate 21 to form an array.

Figure 18A:
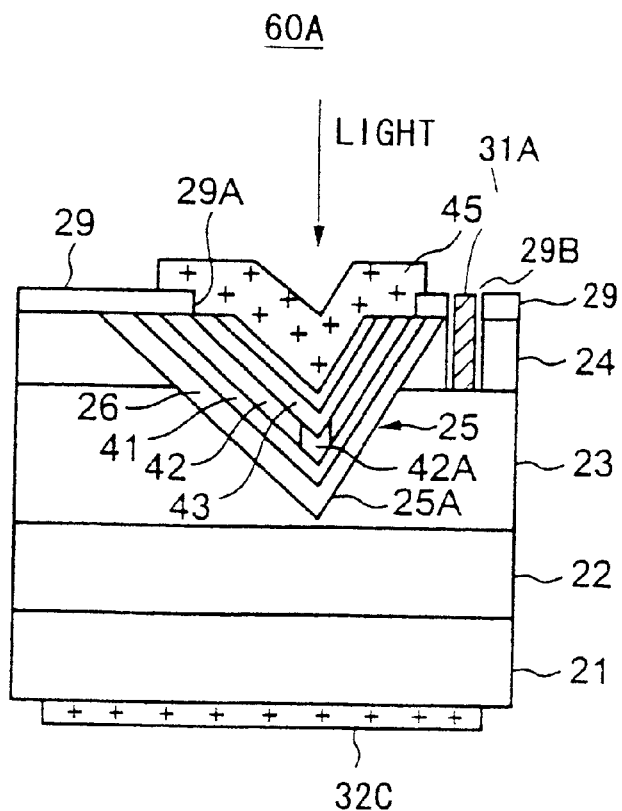
FIGS. 18A and 18B are diagrams showing the construction of a variable optical filter according to a tenth embodiment of the present invention.
Figure 18B:
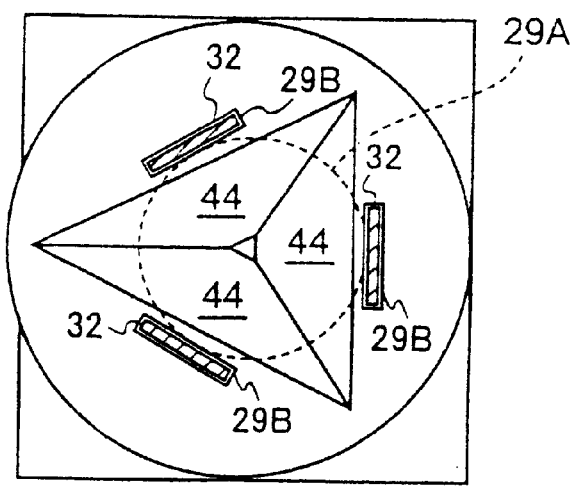

As represented in FIGS. 18A and 18B in detail, the drain electrode 31 and the bias voltage source 101 are omitted in the variable-wavelength filter 60A, and the quantum dot 42A is tuned to a desired wavelength such as the wavelength 11 by applying a suitable voltage to the control electrode 31A from the variable voltage source 105. Further, the reset voltage of the reset voltage source 104 is applied to the transparent electrode pattern 45A via the reset switch 104.

When an optical signal comes in to such a variable-wavelength filter 60A with the wavelength $\lambda_1$, there occurs an optical excitation of electrons and holes in the quantum dot 42A, and the quantum dot 42A shows a saturation of absorption. This state of optical saturated continues due to the fact that the optically excited holes are retained in the quantum dot 42A, and thus, the optical beam of the wavelength $\lambda_1$ coming in thereafter are not absorbed and passes through the variable-wavelength optical filter 60A.

Thus, by irradiating the variable-wavelength optical filter 60A with a weak monitoring optical beam having a white spectrum and by disposing an optical detector such as the photodiode 10 behind the optical filter 60A, it becomes possible, in the optical receiver 120, to detect the optical signal of the wavelength $\lambda_1$ selectively by detecting the optical beam that has passed through the variable-wavelength filter 60A by the photodiode 10.

As represented in FIG. 17, the photodiode 10 is reverse-biased by a bias circuit that includes a biasing voltage source 101A, wherein the bias circuit includes a current detector 102B and the output of the current detector 102B is processed by the signal processing circuit 102A.

In the multiple-wavelength optical receiver 120, it should be noted that the irradiation of the variable-wavelength filter 60A by the optical signal of the wavelengths $\lambda_1$ is identical with the operation of optical writing of one-bit information, while the optical detection using the monitoring optical beam is identical with the operation of optical reading of the one-bit information. Thus, the apparatus 120 of FIG. 17 can also be used as an optical memory device.

In the case the apparatus 120 of FIG. 17 is to be used as an optical memory device, it is also possible to carry out an erasing operation of information by applying a reset voltage of the reset voltage source 103 to the transparent electrode pattern 45A via the reset switch 104 as an erasing voltage. As explained before, it is possible to replace the voltage source 103 and the reset switch 104 by a pulse generator.

FIGS. 18A and 18B show the construction of the variable-wavelength optical filter 60A of FIG. 17 in detail.

Referring to FIGS. 18A and 18B, the variable-wavelength optical filter 60A has a construction similar to that of the optical detector 60 of FIGS. 12A and 12B, except that the source electrode 32 is replaced with the transparent electrode 32C. Further, the drain electrode 31 of FIGS. 12A and 12B is eliminated. Associated with this, no opening corresponding to the opening 29A is formed in the $SiO_2$ film 29 for the source electrode 31.

[Eleventh Embodiment]

Figure 19:
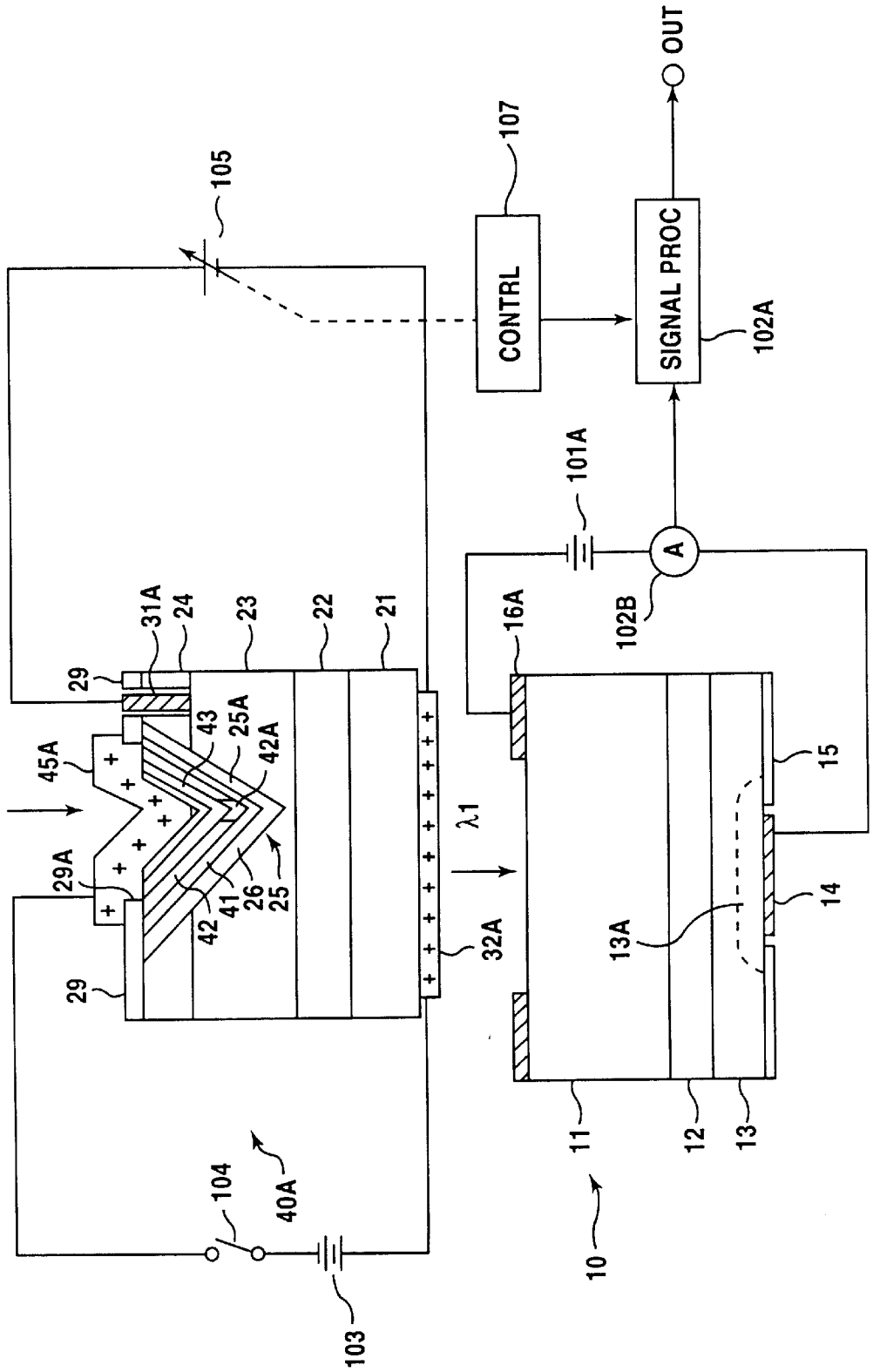
FIG. 19 is a diagram showing the construction of a spectrum analyzer according to an eleventh embodiment of the present invention.

FIG. 19 shows the construction of a spectrum analyzer 140 constructed based on the optical receiver 120 of FIG. 17, wherein the spectrum analyzer 140 has a construction similar to that of FIG. 17 except that the variable voltage source 105 and the signal processing circuit 102A are now controlled by an additional control circuit 107.

Referring to FIG. 19, the control circuit 107 controls the variable voltage source 105 and causes a sweeping of the control voltage applied to the control electrode 31A. As a result, the signal processing circuit 102A produces an output similar to the one explained already with reference to FIG. 16.

As other aspects of the apparatus of FIG. 19 are substantially identical with those of the apparatus of FIG. 17, further description thereof will be omitted.

[Twelfth Embodiment]

Figure 20:
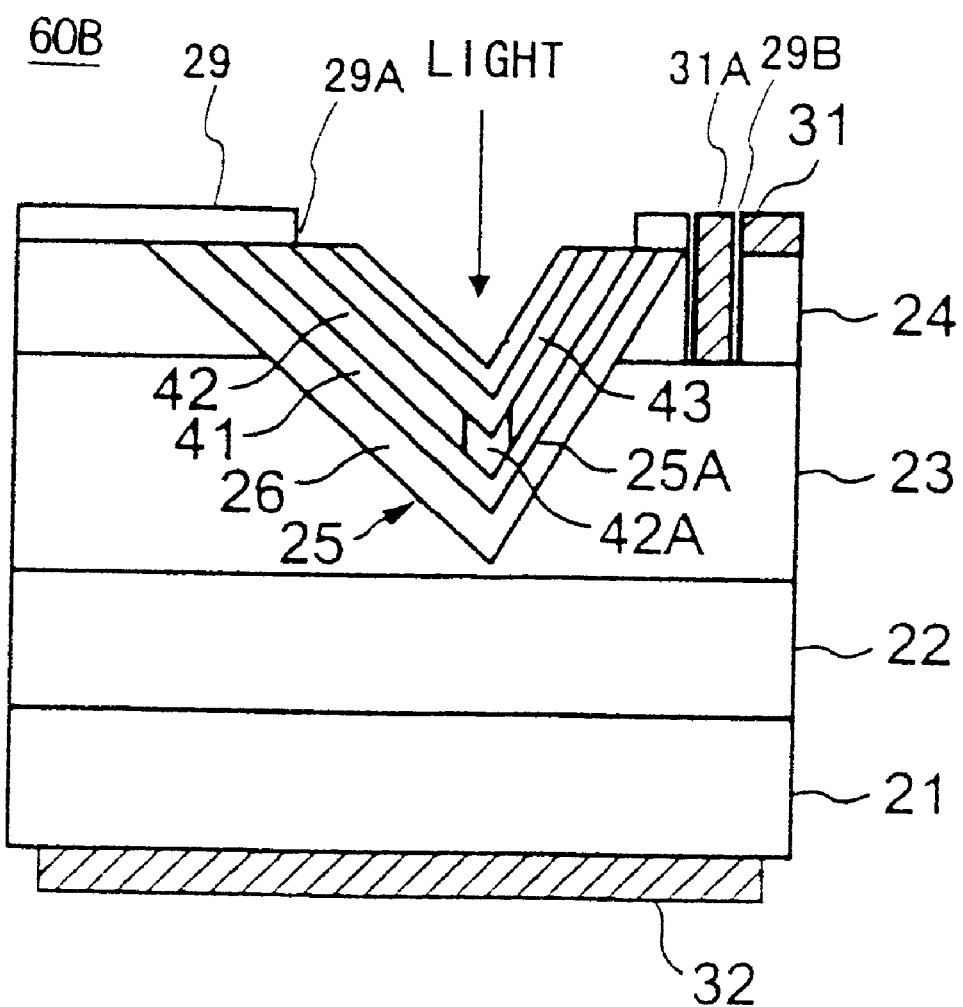
FIG. 20 is a diagram showing the construction of an optical detector according to a twelfth embodiment of the present invention.

FIG. 20 shows the construction of an optical detector 60B according to a twelfth embodiment of the present invention, wherein those parts corresponding to the parts described already are designated by the same reference numerals and the description thereof will be omitted.

Referring to FIG. 20, the optical detector 60B has a construction similar to that of the optical detector 60, except that the transparent electrode pattern 45 is eliminated. According to the construction of FIG. 20, it is not possible to erase the holes in the quantum dot 42A electrically. Nevertheless, it is possible to cause a recombination of the holes with thermally or optically excited electrons.

[Modification]

Figure 21:
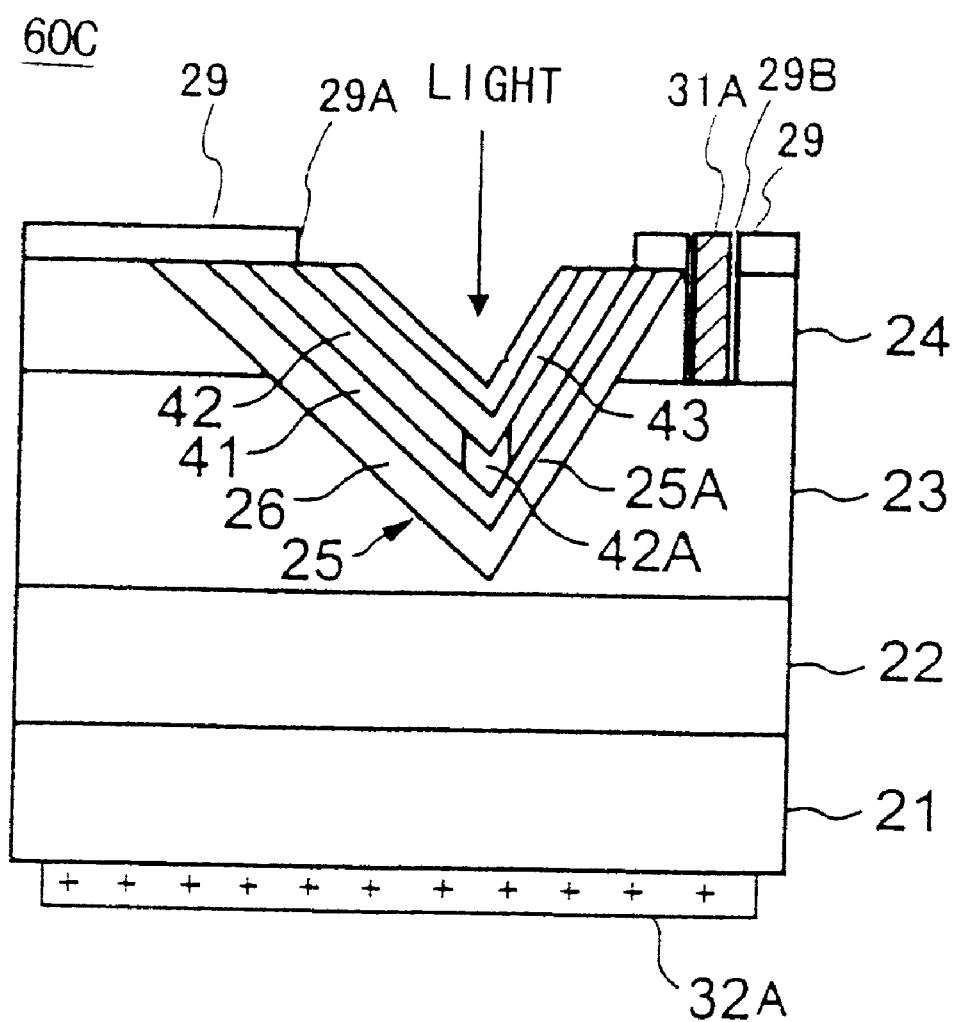
FIG. 21 is a diagram showing the construction of an optical detector according a modification of the twelfth embodiment.

FIG. 21 shows the construction of a variable-wavelength filter 60C according to a modification of the variable-wavelength filter 60A of FIGS. 18A and 18B.

Similarly to the optical detector 60B of FIG. 20, the optical filter 60C lacks the transparent electrode pattern 45 and cannot erase the holes in the quantum dot 42A electrically. The holes in the quantum dot 42A, however, can be erased causing a recombination with thermally or optically excited electrons.

Further, the present invention is not limited to the embodiments described heretofore, but various variations and modifications may be made without departing from the scope of the invention.

What is claimed is:

1. A semiconductor optical detector, comprising:

a first semiconductor layer having a conductivity type;

a second semiconductor layer formed on said first semiconductor layer;

a third semiconductor layer formed on said second semiconductor layer, said third semiconductor layer having said conductivity type;

a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface;

a channel layer covering said plurality of facets continuously in said pyramidal pit, said channel layer having said conductivity type;

a barrier layer formed in said pyramidal pit so as to cover said channel layer;

a cap layer formed in said pyramidal pit so as to cover said barrier layer;

an optical window formed on said cap layer;

a first electrode formed on said third semiconductor layer; and a second electrode formed on said first semiconductor layer.

2. A semiconductor optical detector as claimed in claim 1, wherein said first semiconductor layer comprises an n-type compound semiconductor substrate having a (111)B principal surface, said second semiconductor layer comprises an undoped compound semiconductor layer grown epitaxially on said substrate, and said third semiconductor layer comprises a n-type compound semiconductor layer grown epitaxially on said second semiconductor layer, said channel layer making an electrical contact with said third semiconductor layer at said facets.

3. A semiconductor optical detector as claimed in claim 2, wherein said facet comprises an (111)A surface, and wherein said pyramidal pit has a right tetrahedral shape defined by said (111)A surface.

4. A semiconductor optical detector as claimed in claim 1, wherein said channel layer comprises a semiconductor layer having said conductivity type, and wherein said barrier layer comprises a semiconductor layer having a bandgap substantially larger than a bandgap of said channel layer.

5. A semiconductor optical detector as claimed in claim 1, wherein sad optical window comprises an optically transparent pattern covering said cap layer.

6. A semiconductor optical detector, comprising:

a substrate having a conductivity type;

a first semiconductor layer formed on said substrate, said first semiconductor layer having said conductivity type;

a second semiconductor layer formed on said first semiconductor layer;

a third semiconductor layer formed on said second semiconductor layer, said third semiconductor layer having said conductivity type;

a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface;

a channel layer covering said plurality of facets continuously in said pyramidal pit, said channel layer having said conductivity type;

a barrier layer formed in said pyramidal pit so as to cover said channel layer;

a cap layer formed in said pyramidal pit so as to cover said barrier layer;

a first electrode formed on said third semiconductor layer; and a second electrode formed on a bottom principal surface of said substrate, said second electrode having an optical window.

7. An optical semiconductor memory device, comprising:

a first semiconductor layer having a first conductivity type;

a second semiconductor layer formed on said first semiconductor layer;

a third semiconductor layer formed on said second semiconductor layer, said third semiconductor layer having said first conductivity type;

a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface;

a channel layer covering said plurality of facets continuously in said pyramidal pit, said channel layer having said first conductivity type;

a first barrier layer formed in said pyramidal pit so as to cover said channel layer continuously, said first barrier layer having a second conductivity type;

a hole-accumulation layer formed on said first barrier layer in said pyramidal pit;

a second barrier layer formed in said pyramidal pit so as to cover said hole-accumulation layer, said second barrier layer having said second conductivity type;

a cap layer formed in said pyramidal pit so as to cover said second barrier layer;

an optical window formed on said cap layer;

a first electrode formed on said third semiconductor layer; and a second electrode formed on said first semiconductor layer.

8. An optical semiconductor memory device as claimed in claim 7, wherein said hole-accumulation layer forms a potential barrier of holes on a valence band thereof with respect to said first and second barrier layers.

9. An optical semiconductor memory device as claimed in claim 7, wherein said hole-accumulation layer covers said first barrier layer continuously in said pyramidal pit, said hole-accumulation layer forming a quantum dot in the vicinity of said apex of said pyramidal pit.

10. An optical semiconductor memory device as claimed in claim 7, wherein said hole-accumulation layer comprises a pattern formed on said first barrier layer in the vicinity of said apex of said pyramidal pit with such a limited size that a quantum dot is formed in said hole-accumulation layer, said second barrier layer covering said hole-accumulation layer on said first barrier layer.

11. An optical semiconductor memory device as claimed in claim 7, wherein said optical window comprises a transparent conductor pattern forming a transparent electrode.

12. An optical semiconductor memory device as claimed in claim 7, wherein said first semiconductor layer comprises an n-type compound semiconductor substrate having a (111)B principal surface, said second semiconductor layer comprises an undoped compound semiconductor layer grown epitaxially on said compound semiconductor substrate, and said third semiconductor layer comprises an n-type compound semiconductor layer grown epitaxially on said second semiconductor layer, said channel layer making an electrical contact with said third semiconductor layer at said facets.

13. An optical semiconductor memory device as claimed in claim 12, wherein said facets comprises a (111)A surface, and wherein said pyramidal pit has a right tetrahedral shape defined by said (111)A surface.

14. An optical semiconductor memory device, comprising:
a substrate having a first conductivity type;
a first semiconductor layer formed on said substrate, said first semiconductor layer having said first conductivity type;
a second semiconductor layer formed on said first semiconductor layer;
a third semiconductor layer formed on said second semiconductor layer, said third semiconductor layer having said first conductivity type;
a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface;
a channel layer covering said plurality of facets continuously in said pyramidal pit, said channel layer having said first conductivity type;
a first barrier layer formed in said pyramidal pit so as to cover said channel layer continuously, said first barrier layer having a second conductivity type;
a hole-accumulation layer formed on said first barrier layer in said pyramidal pit;
a second barrier layer formed in said pyramidal pit so as to cover said hole-accumulation layer, said second barrier layer having said second conductivity type;
a cap layer formed in said pyramidal pit so as to cover said second barrier layer;
a first electrode formed on said third semiconductor layer; and
a second electrode formed on a bottom principal surface of said substrate,
said second electrode having an optical window.

15. A quantum semiconductor device, comprising:
a first semiconductor layer having a first conductivity type;
a second semiconductor layer formed on said first semiconductor layer;
a third semiconductor layer formed on said second semiconductor layer, said third semiconductor layer having said first conductivity type;
a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface;
a channel layer covering said plurality of facets continuously in said pyramidal pit, said channel layer having said first conductivity type;
a first barrier layer formed in said pyramidal pit so as to cover said channel layer continuously, said first barrier layer having a second conductivity type;
a hole-accumulation layer formed on said first barrier layer in said pyramidal pit;
a second barrier layer formed in said pyramidal pit so as to cover said hole-accumulation layer, said second barrier layer having said second conductivity type;
a cap layer formed in said pyramidal pit so as to cover said second barrier layer;
a first electrode formed on said first semiconductor layer; and
a second electrode formed on said second semiconductor layer in Schottky contact therewith.

16. A quantum semiconductor device as claimed in claim 1, wherein said second electrode is formed in a contact hole formed in said third semiconductor layer so as to expose said second semiconductor layer.

17. A quantum semiconductor device as claimed in claim 15, wherein said second electrode comprises a plurality of Schottky electrodes each making a Schottky contact with said second semiconductor layer.

18. A quantum semiconductor device as claimed in claim 17, wherein said plurality of Schottky electrodes are disposed with symmetry with respect to said pyramidal pit.

19. A quantum semiconductor device as claimed in claim 15, wherein said first semiconductor layer comprises an n-type compound semiconductor substrate having a (111)B principal surface, said second semiconductor layer comprises an undoped compound semiconductor layer grown epitaxially on said compound semiconductor substrate, said third semiconductor layer comprises an n-type compound semiconductor layer grown epitaxially on said second semiconductor layer, said channel layer making an electrical contact with said third semiconductor layer at said plurality of facets.

20. A quantum semiconductor device as claimed in claim 15, wherein said facets comprises a (111)A surface and wherein said pyramidal pit has a right tetrahedral shape defined by said (111)A surface.

21. A quantum semiconductor device as claimed in claim 15, wherein said channel layer comprises a semiconductor layer having said first conductivity type, said first and second barrier layers comprising an undoped semiconductor layer having a bandgap substantially larger than a bandgap of said channel layer.

22. A quantum semiconductor device as claimed in claim 15, further comprising an optically transparent optical pattern formed on said cap layer as an optical window.

23. A quantum semiconductor device as claimed in claim 22, wherein said optically transparent pattern comprises a transparent conductor film.

24. A quantum semiconductor device as claimed in claim 15, further comprising a third electrode on said third semiconductor layer.

25. A quantum semiconductor device as claimed in claim 15, wherein said first electrode has an optical window.

26. A spectrum analyzer, comprising:

a quantum semiconductor device comprising a first semiconductor layer having a first conductivity type; a second semiconductor layer formed on said first semiconductor layer; a third semiconductor layer formed on said second semiconductor layer, said third semiconductor layer having said first conductivity type; a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface; a channel layer covering said plurality of facets continuously in said pyramidal pit, said channel layer having said first conductivity type; a first barrier layer formed in said pyramidal pit so as to cover said channel layer continuously, said first barrier layer having a second conductivity type; a hole-accumulation layer formed on said first barrier layer in said pyramidal pit; a second barrier layer formed in said pyramidal pit so as to cover said hole-accumulation layer, said second barrier layer having said second conductivity type; a cap layer formed in said pyramidal pit so as to cover said second barrier layer; a first electrode formed on said first semiconductor layer; a second electrode formed on said second semiconductor layer in Schottky contact therewith; and a third electrode provided on said third semiconductor layer;

a bias voltage source connected across said first and third electrodes;

a current detection circuit connected in series to said bias voltage source between said first and third electrodes;

a control voltage source supplying a control voltage to said second electrode; and a controller controlling said control voltage source so as to cause a sweeping of said control voltage.

27. A spectrum analyzer as claimed in claim 26, wherein said quantum semiconductor device forms on a substrate, together with other quantum semiconductor devices having an identical construction, an array.

28. A spectrum analyzer as claimed in claim 26, wherein said quantum semiconductor device further comprises a transparent conductive pattern on said cap layer, and wherein said spectrum analyzer further comprises a reset circuit applying a reset voltage to said transparent conductive pattern.

29. An optical receiver of a wavelength-multiplexed optical signal, comprising:

a quantum semiconductor device comprising a first semiconductor layer having a first conductivity type; a second semiconductor layer formed on said first semiconductor layer; a third semiconductor layer formed on said second semiconductor layer, said third semiconductor layer having said first conductivity type; a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface; a channel layer covering said plurality of facets continuously in said pyramidal pit, said channel layer having said first conductivity type; a first barrier layer formed in said pyramidal pit so as to cover said channel layer continuously, said first barrier layer having a second conductivity type; a hole-accumulation layer formed on said first barrier layer in said pyramidal pit; a second barrier layer formed in said pyramidal pit so as to cover said hole-accumulation layer, said second barrier layer having said second conductivity type; a cap layer formed in said pyramidal pit so as to cover said second barrier layer; a first electrode formed on said first semiconductor layer; a second electrode formed on said second semiconductor layer in Schottky contact therewith; and a third electrode provided on said third semiconductor layer;

a bias voltage source connected across said first and third electrodes;

a current detection circuit connected in series to said bias voltage source between said first and third electrodes; and a control voltage source supplying a control voltage to said second electrode.

30. An optical receiver as claimed in claim 29, wherein said quantum semiconductor device forms on a substrate, together with other quantum semiconductor devices having an identical construction, an array.

31. An optical receiver as claimed in claim 29, wherein said quantum semiconductor device further comprises a transparent conductive pattern on said cap layer, and wherein said optical receiver further comprises a reset circuit applying a reset voltage to said transparent conductive pattern.

32. An optical memory device, comprising:

a quantum semiconductor device comprising a first semiconductor layer having a first conductivity type; a second semiconductor layer formed on said first semiconductor layer; a third semiconductor layer formed on said second semiconductor layer, said third semiconductor layer having said first conductivity type; a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface; a channel layer covering said plurality of facets continuously in said pyramidal pit, said channel layer having said first conductivity type; a first barrier layer formed in said pyramidal pit so as to cover said channel layer continuously, said first barrier layer having a second conductivity type; a hole-accumulation layer formed on said first barrier layer in said pyramidal pit; a second barrier layer formed in said pyramidal pit so as to cover said hole-accumulation layer, said second barrier layer having said second conductivity type; a cap layer formed in said pyramidal pit so as to cover said second barrier layer; a first electrode formed on said first semiconductor layer; a second electrode formed on said second semiconductor layer in Schottky contact therewith; and a third electrode provided on said third semiconductor layer;

a bias voltage source connected across said first and third electrodes;

a current detection circuit connected in series to said bias voltage source between said first and third electrodes; and a control voltage source supplying a control voltage to said second electrode.

33. An optical memory device as claimed in claim 32, wherein said quantum semiconductor device forms on a substrate, together with other quantum semiconductor devices having an identical construction, an array.

34. An optical memory device as claimed in claim 32, wherein said quantum semiconductor device further comprises a transparent conductive pattern on said cap layer, and wherein said optical memory device comprises an erasing circuit applying an erasing voltage to said transparent conductive pattern.

35. A spectrum analyzer, comprising:

a quantum semiconductor device comprising a first semiconductor layer having a first conductivity type; a second semiconductor layer formed on said first semiconductor layer; a third semiconductor layer formed on said second semiconductor layer, said third semiconductor layer having said first conductivity type; a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface; a channel layer covering said plurality of facets continuously in said pyramidal pit, said channel layer having said first conductivity type; a first barrier layer formed in said pyramidal pit so as to cover said channel layer continuously, said first barrier layer having a second conductivity type; a hole-accumulation layer formed on said first barrier layer in said pyramidal pit; a second barrier layer formed in said pyramidal pit so as to cover said hole-accumulation layer, said second barrier layer having said second conductivity type; a cap layer formed in said pyramidal pit so as to cover said second barrier layer; a first electrode formed on said first semiconductor layer; a second electrode formed on said second semiconductor layer in Schottky contact therewith; and a third electrode provided on said third semiconductor layer, said second electrode having an optical window;

an optical detector optically coupled to said quantum semiconductor device at said optical window, said optical detector detecting an optical beam passed through said quantum semiconductor device;

a control voltage source supplying a control voltage to said second electrode; and a controller controlling said control voltage source so as to cause a sweeping of said control voltage.

36. A spectrum analyzer as claimed in claim 35, wherein said quantum semiconductor device forms on a substrate, together with other quantum semiconductor devices having an identical construction, an array.

37. A spectrum analyzer as claimed in claim 35, wherein said quantum semiconductor device further comprises a transparent conductive pattern on said cap layer, and wherein said spectrum analyzer further comprises a reset circuit applying a reset voltage to said transparent conductive pattern.

38. An optical receiver of a wavelength-multiplexed optical signal, comprising:

a quantum semiconductor device comprising a first semiconductor layer having a first conductivity type; a second semiconductor layer formed on said first semiconductor layer; a third semiconductor layer formed on said second semiconductor layer, said third semiconductor layer having said first conductivity type; a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface; a channel layer covering said plurality of facets continuously in said pyramidal pit, said channel layer having said first conductivity type; a first barrier layer formed in said pyramidal pit so as to cover said channel layer continuously, said first barrier layer having a second conductivity type; a hole-accumulation layer formed on said first barrier layer in said pyramidal pit; a second barrier layer formed in said pyramidal pit so as to cover said hole-accumulation layer, said second barrier layer having said second conductivity type; a cap layer formed in said pyramidal pit so as to cover said second barrier layer; a first electrode formed on said first semiconductor layer; a second electrode formed on said second semiconductor layer in Schottky contact therewith; and a third electrode provided on said third semiconductor layer, said second electrode having an optical window;

an optical detector optically coupled to said quantum semiconductor device at said optical window, said optical detector detecting an optical beam passed through said quantum semiconductor device;

a control voltage source supplying a control voltage to said second electrode; and a controller controlling said control voltage source so as to cause a sweeping of said control voltage.

39. An optical receiver as claimed in claim 38, wherein said quantum semiconductor device forms on a substrate, together with other quantum semiconductor devices having an identical construction, an array.

40. An optical receiver as claimed in claim 38, wherein said quantum semiconductor device further comprises a transparent conductive pattern on said cap layer, and wherein said spectrum analyzer further comprises a reset circuit applying a reset voltage to said transparent conductive pattern.

41. An optical memory device, comprising:

a quantum semiconductor device comprising a first semiconductor layer having a first conductivity type; a second semiconductor layer formed on said first semiconductor layer; a third semiconductor layer formed on said second semiconductor layer, said third semiconductor layer having said first conductivity type; a pyramidal pit formed in said third semiconductor layer so as to invade into said second semiconductor layer, said pyramidal pit being defined by a plurality of facets merging together at an apex located in said second semiconductor layer in the vicinity of an interface to said first semiconductor layer, said apex being located with an offset from said interface; a channel layer covering said plurality of facets continuously in said pyramidal pit, said channel layer having said first conductivity type; a first barrier layer formed in said pyramidal pit so as to cover said channel layer continuously, said first barrier layer having a second conductivity type; a hole-accumulation layer formed on said first barrier layer in said pyramidal pit; a second barrier layer formed in said pyramidal pit so as to cover said hole-accumulation layer, said second barrier layer having said second conductivity type; a cap layer formed in said pyramidal pit so as to cover said second barrier layer; an optical window formed on said cap layer; a first electrode formed on said first semiconductor layer; a second electrode formed on said second semiconductor layer in Schottky contact therewith; and a third electrode provided on said third semiconductor layer, said second electrode having an optical window;

an optical detector optically coupled to said quantum semiconductor device at said optical window, said optical detector detecting an optical beam passed through said quantum semiconductor device; and a control voltage source supplying a control voltage to said second electrode.

42. An optical memory device as claimed in claim 41, wherein said quantum semiconductor device forms on a substrate, together with other quantum semiconductor devices having an identical construction, an array.

43. An optical memory device as claimed in claim 41, wherein said quantum semiconductor device further comprises a transparent conductive pattern on said cap layer, and wherein said optical memory device further comprises an erasing circuit applying an erasing voltage to said transparent conductive pattern.

* * * * *